US012720989B2

(12) United States Patent
Na et al.

(10) Patent No.: US 12,720,989 B2
(45) Date of Patent: Aug. 25, 2026

(54) DISPLAY DEVICE AND DISPLAY PANEL

(71) Applicant: LG Display Co., Ltd., Seoul (KR)

(72) Inventors: YunJin Na, Paju-si (KR); Suyeong Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/747,114

(22) Filed: Jun. 18, 2024

(65) Prior Publication Data

US 2025/0143125 A1 May 1, 2025

(30) Foreign Application Priority Data

Oct. 30, 2023 (KR) ........................ 10-2023-0147160

(51) Int. Cl.

| | |
|---|---|
| ***G09G 3/3233*** | (2016.01) |
| ***H10D 86/40*** | (2025.01) |
| ***H10D 86/60*** | (2025.01) |
| ***H10K 59/131*** | (2023.01) |
| *H10K 59/35* | (2023.01) |

(52) U.S. Cl.

CPC ....... *H10K 59/1315* (2023.02); *H10D 86/441* (2025.01); *H10D 86/60* (2025.01); *H10K 59/35* (2023.02)

(58) Field of Classification Search

CPC ..... H10K 59/131; H10K 59/35; H10D 86/441

See application file for complete search history.

(56) References Cited

U.S. PATENT DOCUMENTS

| | | | | |
|---|---|---|---|---|
| 2018/0240377 | A1* | 8/2018 | Xu | G02F 1/13306 |
| 2023/0189590 | A1* | 6/2023 | Choi | H10K 59/00 |
| 2023/0320147 | A1* | 10/2023 | Son | G09G 3/3291 |
| 2024/0373698 | A1* | 11/2024 | Lee | H10K 59/131 |

* cited by examiner

*Primary Examiner* — Yuzhen Shen

(74) *Attorney, Agent, or Firm* — Seed Intellectual Property Law Group LLP

(57) ABSTRACT

A display device includes a substrate including an active area and a non-active area. A plurality of subpixels is arranged on the active area and the non-active area includes a pad area located in a column direction from the active area. The display device includes a plurality of gate lines arranged in the active area and each extending in the row direction, a plurality of data lines arranged in the active area and each extending in a column direction, a plurality of pads disposed in the pad area, and a plurality of link lines electrically connecting a plurality of pads and a plurality of data lines. Each of the plurality of link lines may include a horizontal link line disposed in the active area and extending in the row direction and a vertical link line disposed in the active area and extending in the column direction.

20 Claims, 17 Drawing Sheets

DL_RB1 DL_RB2 DL_RB3
DL_G1 DL_G2 DL_G3 DL_G4 CNT_DL
CNT_LIA
HLIA_G4
G_SPL13
G_SPL12
GL HLIA_RB3
G_SPL11
L
G_SPL10
HLIA_G3
G_SPL9
G_SPL8
HLIA_RB2
G_SPL7
L
G_SPL6
G_SPL
HLIA_G2
G_SPL5
GLb
G_SPL4
HLIA_RB1
GLc
G_SPL3
L
GLd
G_SPL2
GLe HLIA_G1
G_SPL1
GLa
UP
VLIA_G4 VLIA_RB3 VLIA_G3 VLIA_RB2 VLIA_G2 VLIA_RB1 VLIA_G1

DISPLAY DEVICE AND DISPLAY PANEL

CROSS REFERENCE TO RELATED APPLICATION

This application claims priority from Korean Patent Application No. 10-2023-0147160, filed on Oct. 30, 2023, which is hereby incorporated by reference for all purposes as if fully set forth herein.

TECHNICAL FIELD

Embodiments of the present disclosure relate to a display device and a display panel.

DESCRIPTION OF THE RELATED ART

A display panel of a display device may include an active area where an image is displayed and a non-active area where an image is not displayed. Various structures, circuits and lines may be disposed in the non-active area (which is also referred to as a non-display area or bezel) of the display panel. Accordingly, it is not easy to reduce the bezel of the display panel.

BRIEF SUMMARY

The inventors of the present disclosure have appreciated the various technical problems in the related art, including the difficulty of reducing the bezel of the display panel. In particular, since the link lines for transmitting data signals to data lines are arranged in the non-active area of the display panel, it is not easy to reduce the bezel. Accordingly, various embodiments of the present disclosure are directed to addressing the technical problems in the related art, including the above-identified problem.

Embodiments of the present disclosure may provide a display panel and a display device having a data link structure for bezel reduction.

Embodiments of the present disclosure may provide a display panel and a display device with a data link structure capable of reducing image abnormalities caused by crosstalk between a link line and a gate line.

Embodiments of the present disclosure may provide a display panel and a display device with a data link structure capable of reducing a resistance in a transmission path of a common driving voltage.

A display device according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, a second pad disposed in the pad area, a second data line disposed in the active area and extending in the column direction, a second horizontal link line disposed in the active area, extending in the row direction, and electrically connected to the second data line, a second vertical link line disposed in the active area, extending in the column direction, and electrically connecting the second horizontal link line and the second pad, first subpixels connected to the first data line and emitting a first color light, second subpixels connected to the second data line and emitting the first color light, and two or more subpixel lines which emit the first color light and are disposed between the first horizontal link line and the second horizontal link line.

A display panel according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, a first gate line overlapping with the first horizontal link line, a second pad disposed in the pad area, a second data line disposed in the active area and extending in the column direction, a second horizontal link line disposed in the active area, extending in the row direction, and electrically connected to the second data line, a second vertical link line disposed in the active area, extending in the column direction, and electrically connecting the second horizontal link line and the second pad, a second gate line overlapping with the second horizontal link line, and a third gate line disposed between the first gate line and the second gate line and having no overlapping horizontal link line.

A display device according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, and a common driving voltage line for supplying a common driving voltage to a common electrode of a light emitting device of each of subpixels.

A display device according to embodiments of the present disclosure may further include at least one of a horizontal metal line disposed to extend in the row direction, located within a first metal layer, and spaced apart from the first horizontal link line, and a vertical metal line disposed to extend in the column direction, located in a second metal layer, and spaced apart from the first vertical link line.

At least one of the horizontal metal line and the vertical metal line may be electrically floating or electrically connected to the common driving voltage line.

According to the embodiments of the present disclosure, there may provide a display panel and a display device having a data link structure for bezel reduction.

According to the embodiments of the present disclosure, there may provide a display panel and a display device with a data link structure capable of reducing image abnormalities caused by crosstalk between a link line and a gate line.

According to the embodiments of the present disclosure, there may provide a display panel and a display device with a data link structure capable of reducing a resistance in a transmission path of a common driving voltage.

According to embodiments of the present disclosure, it is possible to reduce the weight of the display panel and display device by reducing a bezel through the data link structure.

DETAILED DESCRIPTION

Figure 1:
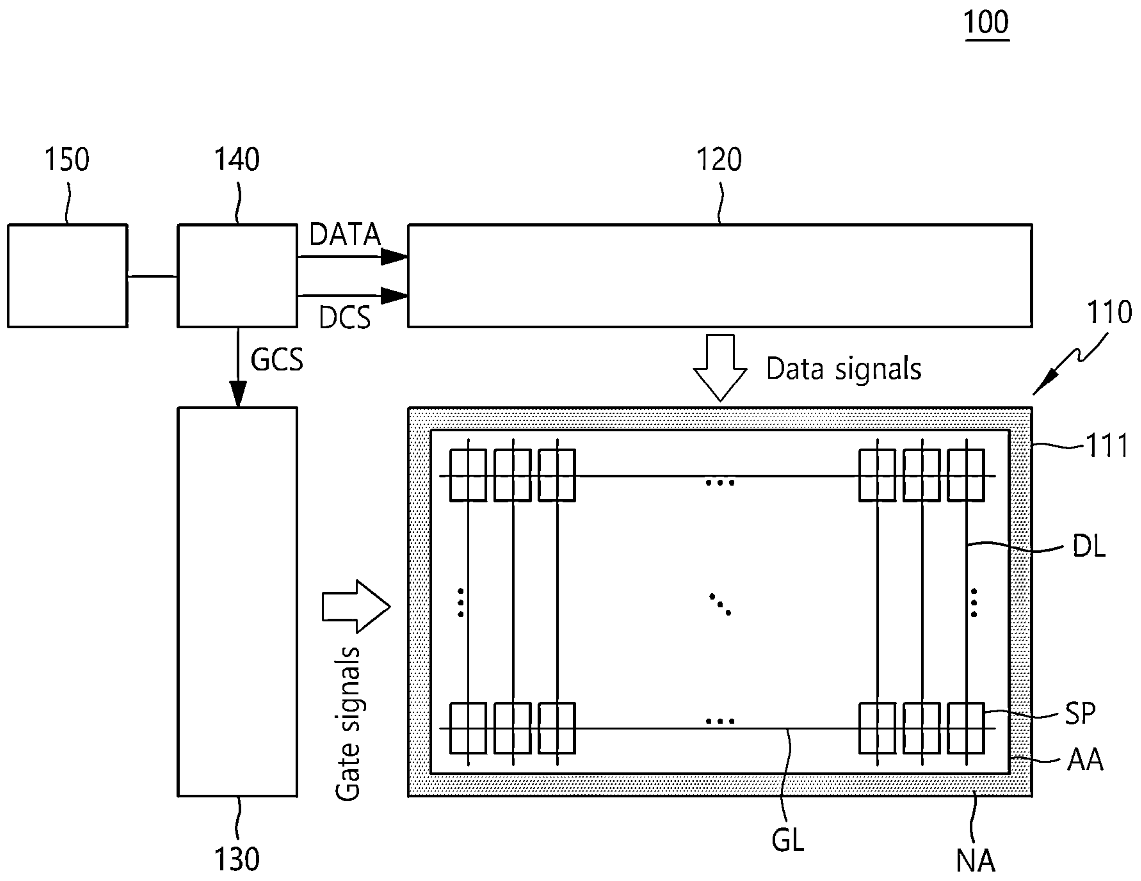
FIG. 1 is a system configuration diagram of a display device according to embodiments of the present disclosure.

Hereinafter, embodiments of the disclosure are described in detail with reference to the accompanying drawings. In assigning reference numerals to components of each drawing, the same components may be assigned the same numerals even when they are shown on different drawings. When determined to make the subject matter of the disclosure unclear, the detailed of the known art or functions may be skipped. As used herein, when a component "includes," "has," or "is composed of" another component, the component may add other components unless the component "only" includes, has, or is composed of" the other component. As used herein, the singular forms "a," "an" and "the" are intended to include the plural forms as well, unless the context clearly indicates otherwise.

Such denotations as "first," "second," "A," "B," "(a)," and "(b)," may be used in describing the components of the disclosure. These denotations are provided merely to distinguish a component from another, and the essence, order, or number of the components are not limited by the denotations.

In describing the positional relationship between components, when two or more components are described as "connected," "coupled" or "linked," the two or more components may be directly "connected," "coupled" or "linked," or another component may intervene. Here, the other component may be included in one or more of the two or more components that are "connected," "coupled" or "linked" to each other.

When such terms as, e.g., "after," "next to," "after," and "before," are used to describe the temporal flow relationship related to components, operation methods, and fabricating methods, it may include a non-continuous relationship unless the term "immediately" or "directly" is used.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

When a component is designated with a value or its corresponding information (e.g., level), the value or the corresponding information may be interpreted as including a tolerance that may arise due to various factors (e.g., process factors, internal or external impacts, or noise).

Hereinafter, various embodiments of the disclosure are described in detail with reference to the accompanying drawings.

FIG. 1 is a system configuration diagram of a display device 100 according to embodiments of the present disclosure.

Referring to FIG. 1, a display device 100 according to embodiments of the present disclosure may include a display panel 110 and a display driving circuit as components for displaying an image. The display driving circuit is a circuit for driving the display panel 110, and may include a data driving circuit 120, a gate driving circuit 130, and a display controller 140.

The display panel 110 may include a substrate 111 and a plurality of subpixels SP disposed on the substrate 111.

The substrate 111 of the display panel 110 may include an active area AA capable of displaying an image and a non-active area NA located outside the active area AA. A plurality of subpixels SP for image display may be disposed in the active area AA. The non-active area NA may include a pad area PA located in a first direction (e.g., column direction or row direction) from the active area AA.

In the display panel 110 according to embodiments of the present disclosure, the non-active area NA may be very small. In this specification, the non-active area NA may be also referred to as "a bezel." For example, the non-active area NA may include a first non-active area located outside the active area AA in a first direction, a second non-active area located outside the active area AA in a second direction, a third non-active area located outside the active area AA in a direction opposite to the first direction, and a fourth non-active area located outside the active area AA in the direction opposite to the second direction. Among the first to fourth non-active areas, the first non-active area may include a pad area to which the driving circuit is connected or bonded. Among the first to fourth non-active areas, the second to fourth non-active areas which do not include a pad area may have a very small size.

For another example, a boundary area between the active area AA and the non-active area NA may be bent so that the non-active area NA may be located below the active area. In this case, when the user looks at the display device 100 from the front, there may be little or no non-active area NA visible to the user.

Various types of signal lines for driving a plurality of subpixels SP may be disposed on the substrate 111 of the display panel 110.

The display device 100 according to embodiments of the present disclosure may be a liquid crystal display device or the like, or may be a self-luminous display device in which the display panel 110 emits light by itself. When the display device 100 according to embodiments of the present disclosure is a self-luminous display device, each of the plurality of subpixels SP may include a light emitting device.

For example, the display device 100 according to embodiments of the present disclosure may be an organic light emitting display device in which a light emitting device is implemented as an organic light emitting diode (OLED). For another example, the display device 100 according to embodiments of the present disclosure may be an inorganic light emitting display device in which the light emitting device is implemented as an inorganic-based light emitting diode. For another example, the display device 100 according to embodiments of the present disclosure may be a quantum dot display device in which a light emitting device is implemented with quantum dots, which are semiconductor crystals emitting light by itself.

The structure of each of the plurality of subpixels SP may vary depending on the type of the display device 100. For example, if the display device 100 is a self-luminous display device with the subpixel SP emitting light by itself, each subpixel SP may include a self-luminous light emitting device, one or more transistors, and one or more capacitors.

For example, various types of signal lines may include a plurality of data lines DL supplying data signals (also called data voltages or image signals) and a plurality of gate lines GL for transmitting gate signals (also called scan signals).

For example, the plurality of data lines DL and the plurality of gate lines GL may cross each other. Each of the plurality of data lines DL may be arranged to extend in a first direction. Each of the plurality of gate lines GL may be arranged to extend in a second direction. Here, the first direction may be a column direction and the second direction may be a row direction. Alternatively, the first direction may be a row direction and the second direction may be a column direction. Hereinafter, for convenience of explanation, it will exemplified a case in which each of the plurality of data lines DL is arranged in a column direction, and each of the plurality of gate lines GL is arranged in a row direction.

The data driving circuit 120 is a circuit for driving a plurality of data lines DL, and may output data signals to the plurality of data lines DL.

The data driving circuit 120 may receive image data DATA in digital form from the display controller 140 and convert the received image data into analog data signals to output to a plurality of data lines DL.

For example, the data driving circuit 120 may be connected to the display panel 110 using a tape automated bonding (TAB) method, or may be connected to the bonding pad of the display panel 110 using a chip-on-glass (COG) or chip-on-panel (COP) method, or may be implemented using a chip-on-film (COF) method and connected to the display panel 110.

The data driving circuit 120 may be connected to one side (e.g., the upper or lower side) of the display panel 110. Depending on the driving method, panel design method, etc., the data driving circuit 120 may be connected to both sides (e.g., upper and lower sides) of the display panel 110, or may be connected to two or more of the four sides of the display panel 110.

The data driving circuit 120 may be connected to the outside of the active area AA of the display panel 110, but alternatively, it may be disposed in the active area AA of the display panel 110.

The gate driving circuit 130 is a circuit for driving a plurality of gate lines GL, and may output gate signals to the plurality of gate lines GL.

The gate driving circuit 130 may receive a first gate voltage corresponding to the turn-on level voltage and a second gate voltage corresponding to the turn-off level voltage along with various gate driving control signals GCS, and may generate gate signals and supply the generated gate signals to the plurality of gate lines GL.

In the display device 100 according to embodiments of the present disclosure, the gate driving circuit 130 may be built into the display panel 110 as a gate-in-panel (GIP) type. If the gate driving circuit 130 is a gate-in-panel type, the gate driving circuit 130 may be formed on a substrate of the display panel 110 during the manufacturing process of the display panel 110.

For example, the gate driving circuit 130 may be disposed in the non-active area NA of the display panel 110.

As another example, the gate driving circuit 130 may be disposed in the active area AA of the display panel 110. In this case, as an example, the gate driving circuit 130 may be disposed in a first partial area within the active area AA (e.g., a left area or a right area within the active area AA). As another example, the gate driving circuit 130 may be disposed in a first partial area within the active area AA (e.g., a left area or a right area within the active area AA) and a second partial area (e.g., a right area or a left area within the active area AA).

In the present disclosure, the gate driving circuit 130 built or embedded into the display panel 110 may also be referred to as a "gate-in-panel circuit."

The display controller 140 may be a device for controlling the data driving circuit 120 and the gate driving circuit 130, and may control the driving timing for the plurality of data lines DL and the driving timing of the plurality of gate lines GL.

The display controller 140 may supply a data driving control signal DCS to the data driving circuit 120 to control the data driving circuit 120, and may supply a gate driving control signal GCS to the gate driving circuit 130 to control the gate driving circuit 130.

The display controller 140 may receive input image data from a host system 150 and supply image data DATA to the data driving circuit 120 based on the input image data.

The display controller 140 may be implemented as a separate component from the data driving circuit 120, or may be integrated with the data driving circuit 120 and implemented as an integrated circuit.

The display controller 140 may be a timing controller used in typical display technology, or may be a control device capable of further performing other control functions including a timing controller, or may be a control device different from the timing controller, or may be a control device other than a timing controller, or may be a circuit within the control device. The display controller 140 may be implemented with various circuits or electronic components, such as an integrated circuit (IC), a field programmable gate array (FPGA), an application specific integrated circuit (ASIC), or Processor.

The display controller 140 may be mounted on a printed circuit board, a flexible printed circuit, etc., and may be electrically connected to the data driving circuit 120 and the gate driving circuit 130 through a printed circuit board, a flexible printed circuit.

The display controller 140 may transmit and receive signals with the data driving circuit 120 according to one or more predetermined interfaces. For example, the interface may include a low voltage differential signaling (LVDS) interface, an embedded clock point-point interface (EPI) interface, or a serial peripheral interface (SPI).

In order to provide not only an image display function but also a touch sensing function, the display device 100 according to embodiments of the present disclosure may include a touch sensor and a touch sensing circuit for detecting an occurrence of a touch by a touch object such as a finger or pen or detection a touch position by sensing the touch sensor.

The touch sensing circuit may include a touch driving circuit for driving and sensing a touch sensor to generate and output touch sensing data, and a touch controller for detecting the occurrence of a touch or detecting the touch position using touch sensing data.

The touch sensor may include a plurality of touch electrodes. The touch sensor may further include a plurality of touch lines to electrically connect a plurality of touch electrodes and the touch driving circuit.

The touch sensor may exist outside the display panel 110 in the form of a touch panel or may exist inside the display panel 110. If the touch sensor exists outside the display panel 110 in the form of a touch panel, the touch sensor may be referred to as an external type. If the touch sensor is an external type, the touch panel and the display panel 110 may be manufactured separately and combined during the assembly process. The external touch panel may include a touch panel substrate and a plurality of touch electrodes on the touch panel substrate.

If the touch sensor exists inside the display panel 110, the touch sensor may be formed on the substrate along with signal lines and electrodes related to display driving during the manufacturing process of the display panel 110.

The touch driving circuit may supply a touch driving signal to at least one of the plurality of touch electrodes and generate touch sensing data by sensing at least one of the plurality of touch electrodes.

The touch sensing circuit may perform touch sensing using a self-capacitance sensing method or a mutual-capacitance sensing method.

If the touch sensing circuit performs touch sensing using a self-capacitance sensing method, the touch sensing circuit may perform touch sensing based on the capacitance between each touch electrode and a touch object (e.g., finger, pen, etc.). According to the self-capacitance sensing method, each of the plurality of touch electrodes may serve as a driving touch electrode and a sensing touch electrode. The touch driving circuit may drive all or part of the plurality of touch electrodes and sense all or part of the plurality of touch electrodes.

If the touch sensing circuit performs touch sensing using the mutual-capacitance sensing method, the touch sensing circuit may perform touch sensing based on the capacitance between touch electrodes. According to the mutual-capacitance sensing method, the plurality of touch electrodes may be divided into driving touch electrodes and sensing touch electrodes. The touch driving circuit may drive driving touch electrodes and sense sensing touch electrodes.

The touch driving circuit and the touch controller included in the touch sensing circuit may be implemented as separate devices or as one device. Additionally, the touch driving circuit and the data driving circuit 120 may be implemented as separate devices or as one device.

The display device 100 may further include a power supply circuit which supplies various types of power to the display driving circuit and/or the touch sensing circuit.

The display device 100 according to embodiments of the present disclosure may be a mobile terminal such as a smart phone or tablet, or a monitor or television of various sizes, but is not limited thereto, and may be a display of various types and sizes capable of displaying information or images.

The display device 100 according to embodiments of the present disclosure may further include an electronic device such as a camera (e.g., image sensor) and a detection sensor. For example, the detection sensor may be a sensor for detecting an object or a human body by receiving light such as infrared, ultrasonic, or ultraviolet rays.

Figure 2:
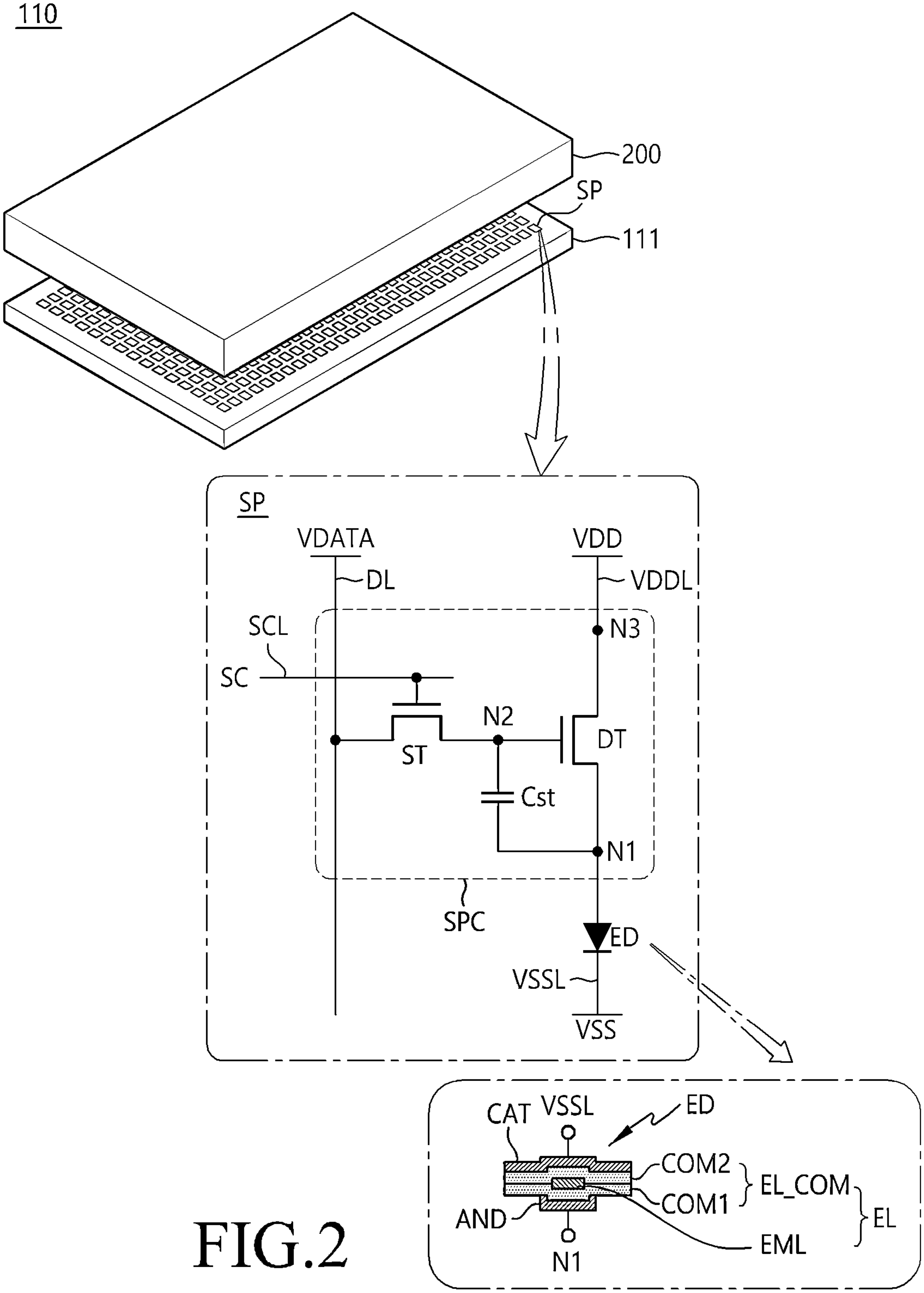
FIG. 2 illustrates a display panel according to embodiments of the present disclosure.

FIG. 2 illustrates a display panel 110 according to embodiments of the present disclosure.

Referring to FIG. 2, the display panel 110 may include a substrate 111 disposed with a plurality of subpixels SP and an encapsulation layer 200 on the substrate 111. Here, the encapsulation layer 200 may also be referred to as an encapsulation substrate or an encapsulation portion.

Referring to FIG. 2, when the display device 100 according to embodiments of the present disclosure is a self-luminous display device, each of the plurality of subpixels SP may include a light emitting device ED and a subpixel circuit SPC for driving the light emitting device ED.

Referring to FIG. 2, the subpixel circuit SPC may include a plurality of pixel driving transistors and at least one capacitor for driving the light emitting device ED. In the present disclosure, the subpixel circuit SPC may drive the light emitting device ED by supplying a driving current to the light emitting device ED at a predetermined timing. The light emitting device ED may be driven by a driving current and emit light.

The plurality of pixel driving transistors may include a driving transistor DT for driving the light emitting device ED, and a scan transistor ST which is turned on or off depending on the scan signal SC.

The driving transistor DT may supply driving current to the light emitting device ED.

The scan transistor ST may be configured to control the electrical state of a corresponding node in the subpixel circuit SPC or to control the state or operation of the driving transistor DT.

At least one capacitor may include a storage capacitor Cst to maintain a constant voltage during the frame.

In order to drive the subpixel SP, a data signal VDATA which is an image signal, and a scan signal SC which is a gate signal may be applied to the subpixel SP. In addition, a common pixel driving voltage including a first driving voltage VDD and a second driving voltage VSS may be applied to the subpixel SP in order to drive the subpixel SP.

The light emitting device ED may include an anode AND, a light emitting device intermediate layer EL, and a cathode CAT. The light emitting device intermediate layer EL may be a layer disposed between the anode AND and the cathode CAT.

In the case that the light emitting device ED is an organic light emitting device, the light emitting device intermediate layer EL may include an emission layer EML and a common layer EL_COM. The common layer EM_COM may include a first common layer COM1 between the anode AND and the emission layer EML, and a second common layer COM2 between the emission layer EML and the cathode. The emission layer EML may be disposed in each subpixel SP.

In comparison, the first common layer COM1 and the second common layer COM2 may be commonly disposed across a plurality of subpixels SP. The emission layer EML may be disposed in each emission area, and the first common layer COM1 and the second common layer COM2 may be commonly disposed across a plurality of emission areas and non-emission areas.

For example, the first common layer COM1 may include a hole injection layer HIL and a hole transport layer HTL, and the second common layer COM2 may include an electron transport layer ETL and an electron injection layer EIL. The hole injection layer may inject holes from the anode AND to the hole transport layer, the hole transport layer may transport holes to the emission layer EML, the electron injection layer may inject electrons from the cathode CAT to the electron transport layer, and the electron transport layer may transport electrons to the emission layer EML.

For example, the cathode CAT may be electrically connected to a second driving voltage line VSSL. A second driving voltage VSS, which is a type of common pixel driving voltage, may be applied to the cathode CAT through the second driving voltage line VSSL. The anode AND may be electrically connected to a first node N1 of the driving transistor DT of each subpixel SP. In the present disclosure, the second driving voltage VSS may also be referred to as a base voltage VSS, and the second driving voltage line VSSL may also be referred to as a base voltage line VSSL.

For example, the anode AND may be a pixel electrode disposed in each subpixel SP, and the cathode CAT may be a common electrode commonly disposed in a plurality of subpixels SP. For another example, the cathode CAT may be a pixel electrode disposed in each subpixel SP, and the anode AND may be a common electrode commonly disposed in a plurality of subpixels SP. Hereinafter, for convenience of explanation, it is assumed that the anode AND is a pixel electrode and the cathode CAT is a common electrode.

Each light emitting device ED may be composed of overlapping parts of an anode AND, a light emitting device intermediate layer EL and a cathode CAT. A predetermined emission area may be formed by each light emitting device ED. For example, the emission area of each light emitting device ED may include an area where the anode AND, the light emitting device intermediate layer EL and the cathode CAT overlap.

For example, the light emitting device ED may be an organic light emitting diode (OLED), an inorganic light emitting diode, or a quantum dot light emitting device. For example, in the case that the light emitting device ED is an organic light emitting diode OLED, the light emitting device intermediate layer EL in the light emitting device ED may include an organic light emitting device intermediate layer EL containing an organic material.

The driving transistor DT may be a driving transistor for supplying driving current to the light emitting device ED. The driving transistor DT may be connected between a first driving voltage line VDDL and the light emitting device ED.

The driving transistor DT may include a first node N1 electrically connected to the light emitting device ED, a second node N2 to which the data signal VDATA is applied, and a third node N3 to which the driving voltage VDD is applied from the first driving voltage line VDDL.

In the driving transistor DT, the second node N2 may be a gate node, the first node N1 may be a source node or a drain node, and the third node N3 may be a drain node or a source node. Hereinafter, for convenience of explanation, it will be described a case in which the second node N2 is a gate node, the first node N1 is a source node, and the third node N3 is a drain node in the driving transistor DT.

The scan transistor ST included in the subpixel circuit SPC illustrated in FIG. 2 may be a switching transistor for transmitting a data signal VDATA, which is an image signal, to the second node N2 which is the gate node of the driving transistor DT.

The scan transistor ST may be controlled on-off by the scan signal SC which is a gate signal applied through the scan line SCL as a type of gate line GL, and may control the electrical connection between the second node N2 of the driving transistor DT and the data line DL. The drain electrode or source electrode of the scan transistor ST may be electrically connected to the data line DL, and the source electrode or drain electrode of the scan transistor ST may be electrically connected to the second node N2 of the driving transistor DT. The gate electrode of the scan transistor ST may be electrically connected to the scan line SCL.

The storage capacitor Cst may be electrically connected between the first node N1 and the second node N2 of the driving transistor DT. The storage capacitor Cst may include a first capacitor electrode electrically connected to the first node N1 of the driving transistor DT or corresponding to the first node N1 of the driving transistor DT, and a second capacitor electrode electrically connected to the second node N2 of the driving transistor DT or corresponding to the second node N2 of the driving transistor DT.

The storage capacitor Cst may be an external capacitor intentionally designed outside the driving transistor DT rather than a parasitic capacitor (e.g., Cgs, Cgd) as an internal capacitor which may exist between the first node N1 and the second node N2 of the driving transistor DT.

Each of the driving transistor DT and the scan transistor ST may be an n-type transistor or a p-type transistor.

The display panel 110 may have a top emission structure or a bottom emission structure.

If the display panel 110 has a top emission structure, at least a portion of the subpixel circuit SPC may overlap with at least a portion of the light emitting device ED in a vertical direction. Alternatively, if the display panel 110 has a bottom emission structure, the subpixel circuit SPC may not overlap with the light emitting device ED in the vertical direction.

As shown in FIG. 2, the subpixel circuit SPC may have 2T-1C structure including two transistors T1 and T2 and one capacitor Cst. In some case, Depending on this, the subpixel circuit SPC may further include one or more transistors or one or more capacitors.

For example, the subpixel circuit SPC may have a 8T-1C structure including eight transistors and a single capacitor. For another example, the subpixel circuit SPC may have a 6T-2C structure including six transistors and two capacitors. For another example, the subpixel circuit SPC may have a 7T-1C structure including seven transistors and one capacitor.

Depending on the structure of the subpixel circuit SPC, there may vary the type and number of gate signal and/or gate lines supplied to the subpixel SP.

In addition, depending on the structure of the subpixel circuit SPC, there may vary the type and number of common pixel driving voltages supplied to the subpixel SP.

Since circuit elements within each subpixel SP (in particular, light emitting devices EDs implemented with organic light emitting diodes (OLEDs) containing organic materials) are vulnerable to external moisture or oxygen, an encapsulation layer 200 may be disposed on the display panel 110 to prevent oxygen from penetrating into the circuit elements (particularly, the light emitting device ED).

The encapsulation layer 200 may be configured in various shapes to prevent the light emitting devices ED from contacting moisture or oxygen. For example, the encapsulation layer 200 may have a structure in which an inorganic layer and an organic layer are stacked. The encapsulation layer 200 may include a first inorganic layer on the light emitting device ED, an organic layer on the first inorganic layer, and a second inorganic layer on the organic layer.

Figure 3:
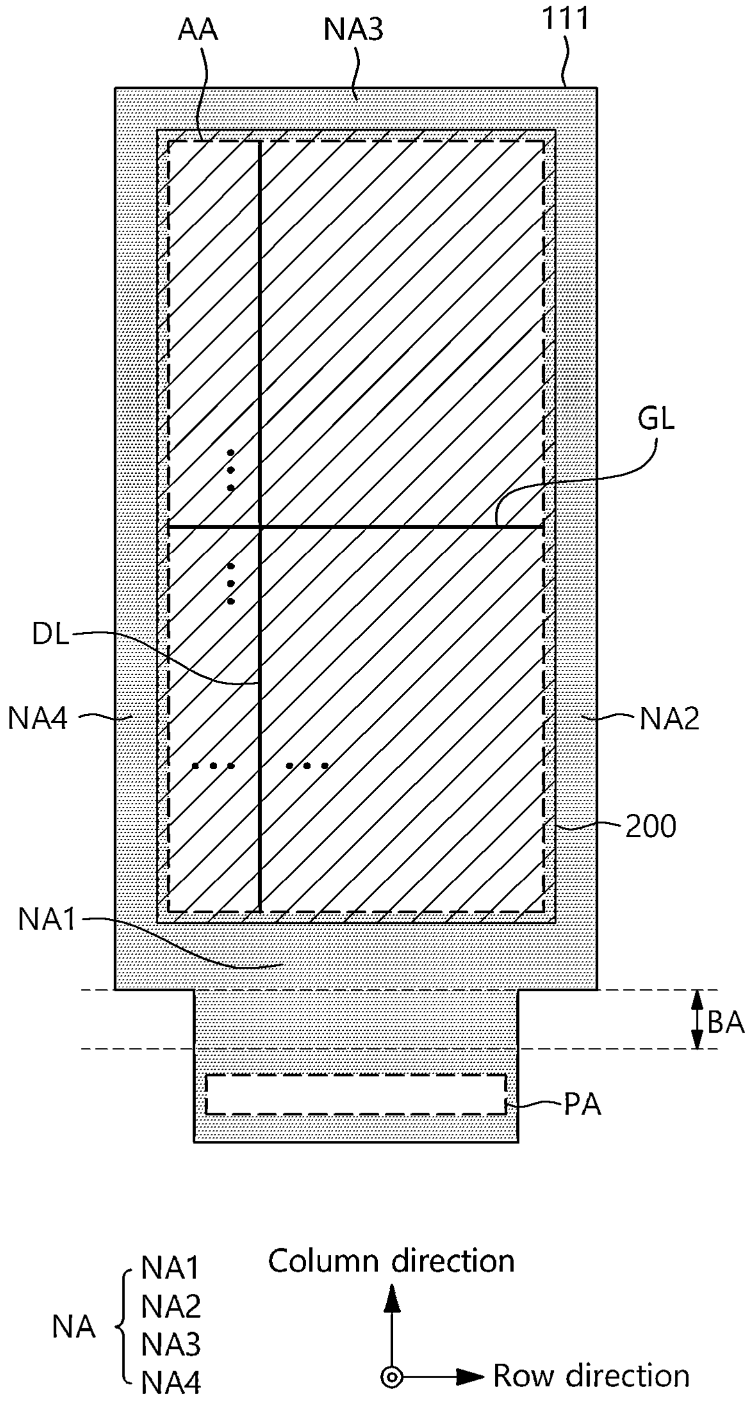
FIG. 3 illustrates a substrate of a display panel according to embodiments of the present disclosure.

FIG. 3 illustrates a substrate 111 of a display panel 110 according to embodiments of the present disclosure.

Referring to FIG. 3, the substrate 111 of the display panel 110 according to embodiments of the present disclosure may include an active area AA capable of displaying an image and a non-active area NA where an image is not displayed.

Referring to FIG. 3, the non-active area NA may include a first non-active area NA1, a second non-active area NA2, a third non-active area NA3, and a fourth non-active area NA4.

The first non-active area NA1 may be located in a first direction from the active area AA. The second non-active area NA2 may be located in a second direction from the active area AA. The third non-active area NA3 may be located in a third direction from the active area AA. The fourth non-active area NA4 may be located in the fourth direction from the active area AA.

For example, the first direction and the third direction may be column directions and opposite directions. The second and fourth directions may be row directions and may be opposite directions. For another example, the first direction and the third direction may be row directions and may be opposite directions. The second and fourth directions are column directions and may be opposite directions. Hereinafter, for convenience of explanation, it will be exemplified a case in which the first and third directions are column directions and opposite directions, and the second and fourth directions are row directions and opposite directions.

For example, the column direction may be a direction in which the data line DL is extended, and the row direction may be a direction in which the gate line GL is extended. For another example, the column direction may be a direction in which the gate line GL is extended, and the row direction may be a direction in which the data line DL is extended. Hereinafter, for convenience of explanation, it will be exemplified a case in which the column direction is the direction in which the data line DL is extended, and the row direction is the direction in which the gate line GL is extended.

Referring to FIG. 3, the first non-active area NA1 may include a pad area PA where a plurality of pads to which at least one driving circuit or printed circuit board are electrically connected are disposed. For example, a plurality of data lines DL, a first common driving voltage line VDDL, and a second common driving voltage line VSSL may be electrically connected to the plurality of pads.

Referring to FIG. 3, the first non-active area NA1 may further include a bending area BA. In this case, the substrate 111 may be a flexible substrate. In some cases, the first non-active area NA1 may not include the bending area BA.

Referring to FIG. 3, the display panel 110 may further include a ground line disposed in the non-active area NA of the substrate 111. The ground line may be disposed from one point of the pad area PA to different point of the pad area PA via the second non-active area NA2, the third non-active area NA3 and the fourth non-active area NA4.

Referring to FIG. 3, in the display panel 110 according to embodiments of the present disclosure, the encapsulation layer 200 may have a structure in which an inorganic layer and an organic layer are stacked. In this case, an edge of the encapsulation layer 200 may be considered as an edge of the organic layer. The encapsulation layer 200 may extend from the active area AA to a portion of the non-active area NA.

Referring to FIG. 3, in order to prevent overflow of the organic layer included in the encapsulation layer 200, the display panel 110 according to embodiments of the present disclosure may include at least one dam or at least one stopper located further outside the organic layer included in the encapsulation layer 200.

Figure 4:
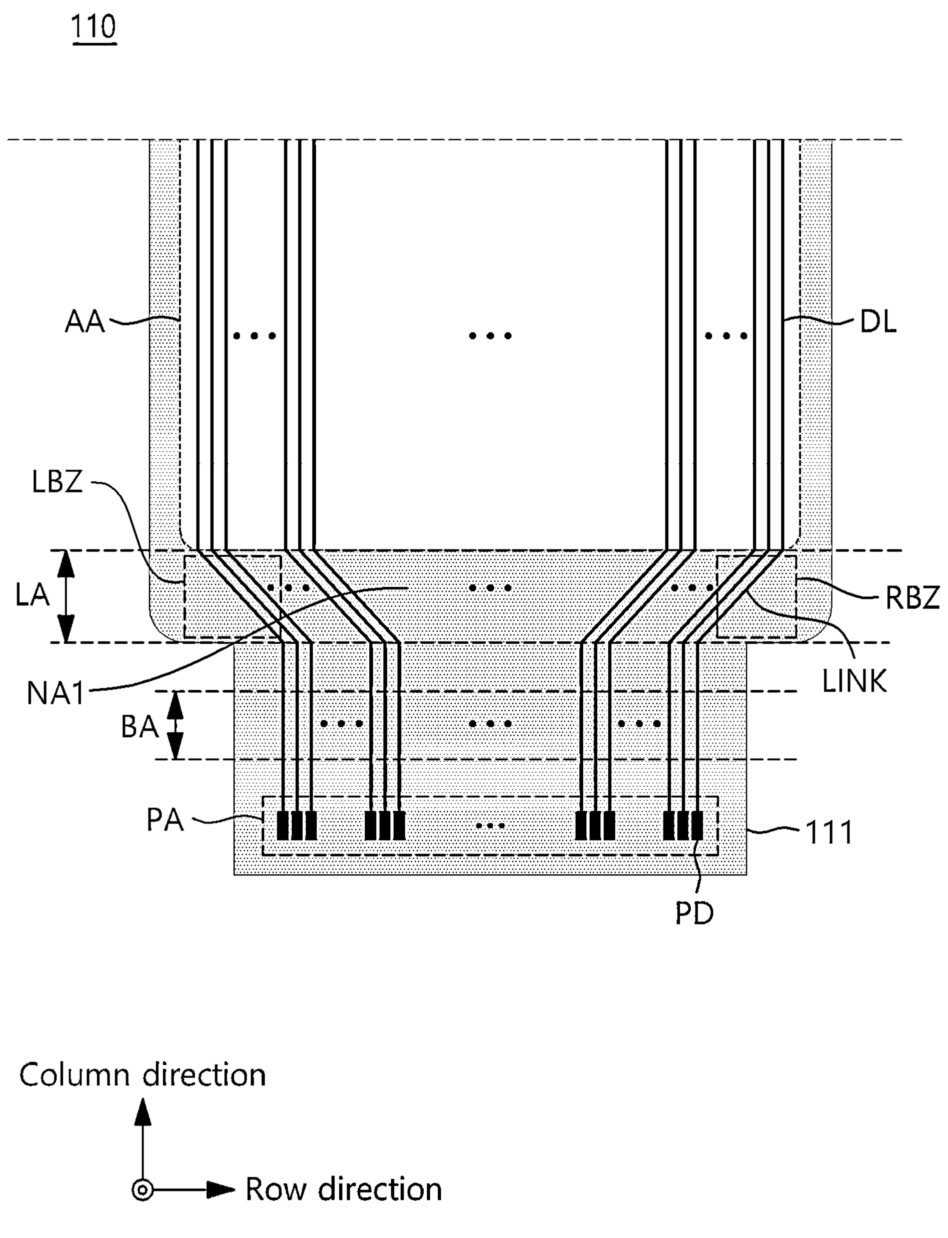
FIG. 4 illustrates a data link structure in a display panel according to embodiments of the present disclosure.

FIG. 4 illustrates a data link structure in a display panel 110 according to embodiments of the present disclosure.

Referring to FIG. 4, the display panel 110 according to embodiments of the present disclosure may include a plurality of data lines DL for supplying data voltage VDATA, and a plurality of pads PD disposed in the pad area PA and to which the data driving circuit 120 is electrically connected.

Referring to FIG. 4, the display panel 110 according to embodiments of the present disclosure may include a data link structure for electrically connecting a plurality of data lines DL and a plurality of pads PD. The data link structure according to embodiments of the present disclosure may include a plurality of link lines LINK.

Referring to FIG. 4, a plurality of link lines LINK may be disposed in the non-active area NA. That is, the plurality of link lines LINK may be disposed in the first non-active area NA1 including the pad area PA.

Referring to FIG. 4, the first non-active area NA1 may further include a link area LA in addition to the pad area PA and the bending area BA.

For example, each of the plurality of link lines LINK may be disposed across the pad area PA, the bending area BA, and link area LA. Each of the plurality of link lines LINK may include a first end electrically connected to the pad PD disposed in the pad area PA and a second end electrically connected to the data line DL disposed in the active area AA. The wiring portion between both ends (i.e., first end and second end) of each of the plurality of link lines LINK may be arranged across the bending area BA and the link area LA.

For example, each of the plurality of link lines LINK may be comprised of one line or two or more lines. Each of the plurality of link lines LINK may be disposed on one metal layer or on two or more metal layers.

Referring to FIG. 4, the bending area BA may be bent during the manufacturing process of the display panel 110. Accordingly, when the user looks at the display device 100 from the front, the bending area BA and the pad area PA maybe not visible from the front.

However, when the user looks at the display device 100 from the front, the link area LA may be recognized as a bezel even if it is covered by the case. Therefore, in order to implement a narrow bezel, there may be required to reduce the area of the link area LA.

Referring to FIG. 4, since all of the plurality of link lines LINK in the link area LA in the first non-active area NA1 are required to be electrically connected to the plurality of data lines DL, the area of the link area LA may increase.

In particular, in the case that a length of the second direction (e.g., row direction) of the pad area PA is shorter than a length of the second direction (e.g., row direction) of the active area AA, each of the plurality of link lines LINK in the left and right areas LBZ, RBZ within the link area LA are required to extend in a diagonal direction and be electrically connected to a plurality of data lines DL. Therefore, the length of the link area LA in the first direction (e.g., column direction) may be increased.

Therefore, as shown in FIG. 4, if the display panel 110 has a data link structure in which a plurality of link lines LINK are disposed in the first non-active area NA1, the area of the link area LA within the first non-active area NA1 may increase. Accordingly, when a user looks at the display device 100 from the front, the link area LA may be recognized as a large bezel.

Therefore, in order to implement a narrow bezel, there may be required a data link structure capable of reducing the area of the link area LA. Accordingly, embodiments of the present disclosure propose a data link structure capable of implementing a narrow bezel.

Hereinafter, it will be described a data link structure capable of implementing a narrow bezel according to embodiments of the present disclosure.

Figure 5:
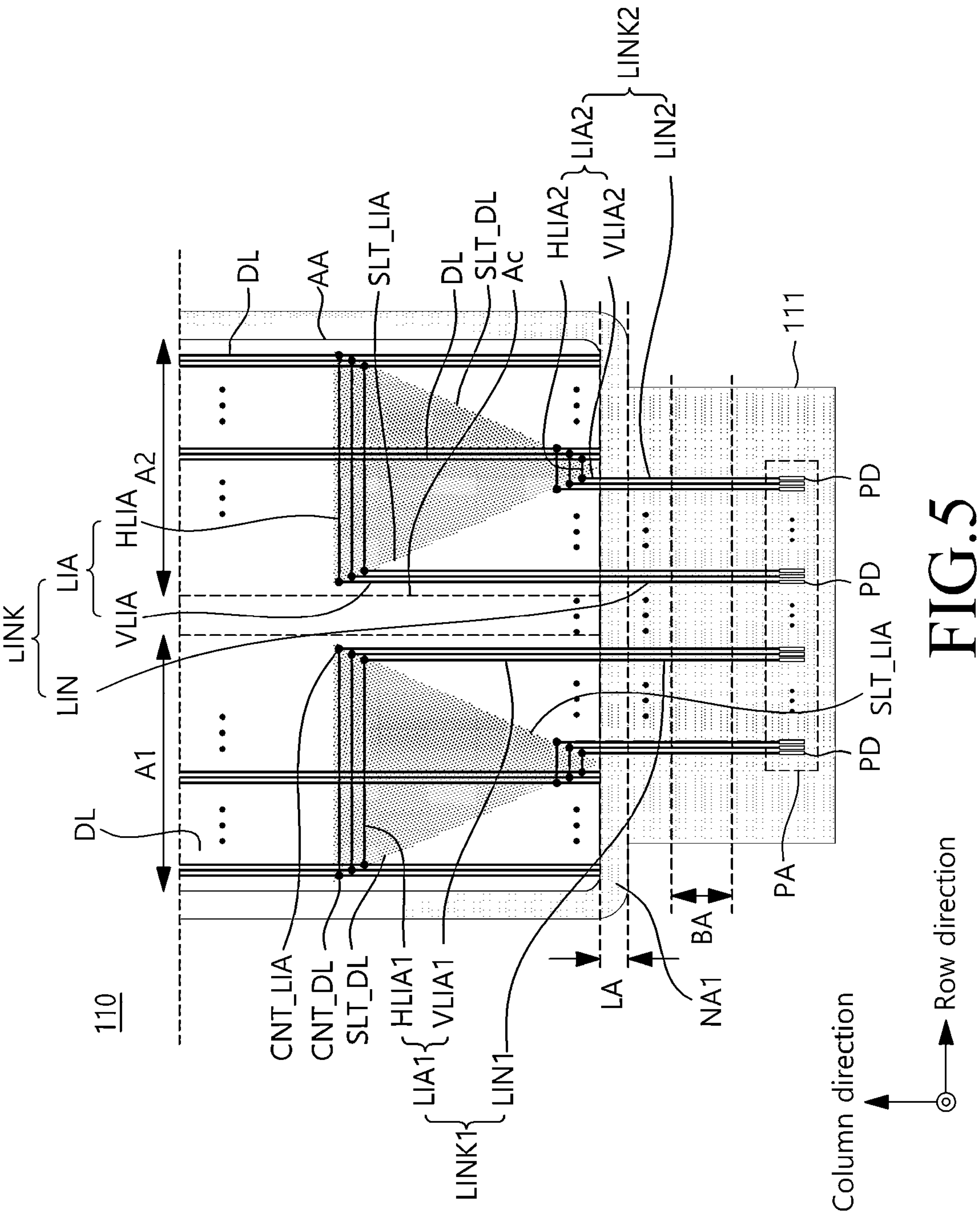
FIG. 5 illustrates a data link structure for reducing a bezel of a display panel according to embodiments of the present disclosure.

FIG. 5 illustrates a data link structure for reducing a bezel of a display panel 110 according to embodiments of the present disclosure.

Referring to FIG. 5, the non-active area NA may include a first non-active area NA1 located in the column direction from the active area AA. The first non-active area NA1 may include a pad area PA and a link area LA located in the column direction from the active area AA.

The display panel 110 according to embodiments of the present disclosure may include a data link structure capable of supplying data voltage VDATA to a plurality of subpixels SP arranged in the active area AA and reducing the bezel.

Referring to FIG. 5, the data link structure for bezel reduction according to embodiments of the present disclosure may include a plurality of link lines LINK which electrically connect a plurality of data lines DL and a plurality of pads PD.

The plurality of data lines DL may be disposed in the active area AA, and may each extend in the column direction, and may be connected to a plurality of subpixels SP disposed in the active area AA.

A plurality of pads PD may be disposed in the pad area PA included in the first non-active area NA1.

The plurality of link lines LINK may electrically connect a plurality of pads PD disposed in the pad area PA included in the first non-active area NA1 and a plurality of data lines DL disposed in the active area AA.

Referring to FIG. 5, each of the plurality of link lines LINK included in the data link structure for the narrow bezel according to embodiments of the present disclosure may include a portion LIA disposed in the active area AA.

According to the data link structure for bezel reduction according to embodiments of the present disclosure, a plurality of link lines LINK and a plurality of data lines DL may be electrically connected within the active area AA. That is, in the data link structure for bezel reduction according to embodiments of the present disclosure, a connection points CNT_DL between the plurality of link lines LINK and the plurality of data lines DL may be located in the active area AA.

Accordingly, each of the plurality of link lines LINK does not need to extend in a diagonal direction in the left and right areas within the link area LA, and each of the plurality of link lines LINK may briefly pass through the link area LA in the column direction and enter the active area AA, and may be connected to the data line DL in the active area AA.

As shown in FIG. 5, since the display panel 110 according to embodiments of the present disclosure has a data link structure for bezel reduction, the length of the link area LA in the column direction may become very short or may be zero, and as a result, the first non-active area NA1 which is visible by the user from the front may become very small.

Referring to FIG. 5, in the data link structure for bezel reduction according to embodiments of the present disclosure, each of the plurality of link lines LINK may include an active area link line LIA disposed in the active area AA.

Referring to FIG. 5, the active area link line LIA may include a horizontal link line HLIA located in the active area AA and extending in the row direction (i.e., horizontal direction) and a vertical link line VLIA located in the active area AA and extending in the column direction (i.e., vertical direction).

Referring to FIG. 5, the vertical link line VLIA may electrically connect a pad PD and the horizontal link line HLIA, and the horizontal link line HLIA may electrically connect the vertical link line VLIA and the data line DL.

Referring to FIG. 5, the horizontal link line HLIA and the vertical link line VLIA may be electrically connected at a link line connection hole CNT_LIA. The horizontal link line HLIA and the data line DL may be electrically connected at a data line connection hole CNT_DL.

Referring to FIG. 5, each of the plurality of link lines LINK may further include a non-active area link line LIN disposed in the first non-active area NA1 included in the non-active area NA.

The non-active area link line LIN may be integrated with the vertical link line VLIA. Alternatively, the non-active area link line LIN may be a line or a wiring electrically connected to the vertical link line VLIA but disposed on a different metal layer from the vertical link line VLIA. Alternatively, the non-active area link line LIN may include a line electrically connected to the vertical link line VLIA but disposed on a different metal layer from the vertical link line VLIA.

Meanwhile, when the display panel 110 according to embodiments of the present disclosure has a data link structure for bezel reduction as shown in FIG. 5, the horizontal link line HLIA included in each of the plurality of link lines LINK may be parallel to a plurality of gate lines GL disposed in the active area AA and each extending in the row direction (i.e., horizontal direction)

In addition, when the display panel 110 according to embodiments of the present disclosure has a data link structure for bezel reduction as shown in FIG. 5, the horizontal link line HLIA included in each of the plurality of link lines LINK may overlap with at least one gate line GL in the vertical direction.

Referring to FIG. 5, among the plurality of vertical link lines VLIA, the length of the vertical link line VLIA electrically connected to the data line DL located further inside may be shorter. Among the plurality of vertical link lines VLIA, the length of the vertical link line VLIA electrically connected to the data line DL located further outside may be longer. The length of the vertical link line VLIA electrically connected to the data line DL located further inside may be shorter than the length of the vertical link line VLIA electrically connected to the data line DL located further outside.

Referring to FIG. 5, among the plurality of horizontal link lines HLIA, the length of the horizontal link line HLIA electrically connected to the data line DL located further inside may be shorter. Among the plurality of horizontal link lines HLIA, the length of the horizontal link line HLIA electrically connected to the data line DL located further outside may be longer. The length of the horizontal link line HLIA electrically connected to the data line DL located further inside may be shorter than the length of the horizontal link line HLIA electrically connected to the data line DL located further outside.

Referring to FIG. 5, among the plurality of horizontal link lines HLIA, the length of the horizontal link line HLIA adjacent to the pad area PA may be shorter. Among the plurality of horizontal link lines HLIA, the length of the horizontal link line HLIA located farther from the pad area PA may be longer. The length of the horizontal link line HLIA adjacent to the pad area PA may be shorter than the length of the horizontal link line HLIA located farther from the pad area PA.

Referring to FIG. 5, a first link line LINK1 may include a first active area link line LIA1 and a first non-active area link line LIN1. The first active area link line LIA1 may include a first horizontal link line HLIA1 and a first vertical link line VLIA1.

Referring to FIG. 5, a second link line LINK2 may include a second active area link line LIA2 and a second non-active area link line LIN2. The second active area link line LIA2 may include a second horizontal link line HLIA2 and a second vertical link line VLIA2.

Referring to FIG. 5, among the first vertical link line VLIA1 and the second vertical link line VLIA2, a length of the first vertical link line VLIA1 electrically connected to a first data line DL1 located on the outer side among the first data line DL1 and the second data line DL2 may be longer than a length of the second vertical link line VLIA2.

Referring to FIG. 5, among the first horizontal link line HLIA1 and the second horizontal link line HLIA2, a length of the first horizontal link line HLIA1 electrically connected to a first data line DL1 located on the outer side among the first data line DL1 and the second data line DL2 may be longer than a length of the second horizontal link line HLIA2.

Referring to FIG. 5, since the length of the first horizontal link line HLA1 is longer than the length of the second horizontal link line HLIA2, a first area where the first horizontal link line HLIA1 overlaps at least one gate line GL may be larger than a second area where the second horizontal link line HLIA2 overlaps at least one gate line GL.

According to the above-described structure, as shown in FIG. 5, the points CNT_DL where the data lines DL and the horizontal link lines HLIA are connected may form two first slant lines SLT_DL. Additionally, the points CNT_LIA where the vertical link lines VLIA and the horizontal link lines HLIA are connected may form two second slant lines SLT_LIA.

As shown in FIG. 5, two triangles may be formed by two first slant lines SLT_DL and two second slant lines SLT_LIA. In each of the two triangles, one of the three sides may be a horizontal side parallel to the horizontal link lines HLIA, and a vertex facing this horizontal side may be located at or near a boundary point between the active area AA and the first non-active area NA1.

Referring to FIG. 5, the active area AA may include a central area Ac, a first area A1 on one side of the central area Ac, and a second area A2 on the other side of the central area Ac.

Referring to FIG. 5, the data lines DL disposed in the first area A1 and the second area A2 may be connected to the non-active area link lines LIN through the active area link lines LIA.

Referring to FIG. 5, alternatively, at least one data line DL disposed in the central area Ac may be directly connected to the non-active area link line LIN rather than via the active area link line LIA.

As described above, when the display panel 110 according to embodiments of the present disclosure has a data link structure for bezel reduction as shown in FIG. 5, the horizontal link line HLIA included in each of the plurality of link lines LINK may be parallel to a plurality of gate lines GL disposed in the active area AA and each extending in the row direction (i.e., horizontal direction), and the horizontal link line HLIA included in each of the plurality of link lines LINK may overlap at least one gate line in the vertical direction.

Accordingly, the horizontal link line HLIA included in each of the plurality of link lines LINK may form a parasitic capacitance with at least one gate line GL. That is, the horizontal link line HLIA included in each of the plurality of link lines LINK may be capacitively connected to at least one gate line GL.

Therefore, a change in the electrical state of at least one gate line GL may also affect the electrical state of the data line DL connected to the horizontal link line HLIA overlapping at least one gate line GL. That is, when the display panel 110 according to embodiments of the present disclosure has a data link structure for bezel reduction as shown in FIG. 5, there may occur the crosstalk between the gate line GL and the horizontal link line HLIA.

That is, a voltage level change of the gate signal (e.g., the scan signal SC in FIG. 2) applied to the at least one gate line GL may generate noise in the data signal VDATA transmitted to the data line DL through the horizontal link line HLIA which overlaps at least one gate line GL. Here, noise generated in the data signal VDATA may have a form of an undesirable peak voltage.

Since the display panel 110 according to embodiments of the present disclosure has a data link structure for bezel reduction as shown in FIG. 5, there is almost no link area LA visible from the front, so the bezel may be significantly reduced, but the crosstalk may occur between the gate line GL and the horizontal link line HLIA.

The crosstalk between the gate lines GL and the horizontal link lines HLIA may cause an image abnormality at or near the two left and right first slant lines SLT_DL formed by the points CNT_DL where the data lines DL and the horizontal link lines HLIA are connected. In embodiments of the present disclosure, an image abnormality in the slant direction which occurs near two first slant lines SLT_DL may be referred to as "slant line crosstalk." Here, the image abnormality may include dark lines and/or bright lines which appear in the form of diagonal lines.

Hereinafter, it will be described the data link structure for bezel reduction in more detail.

Figure 6:
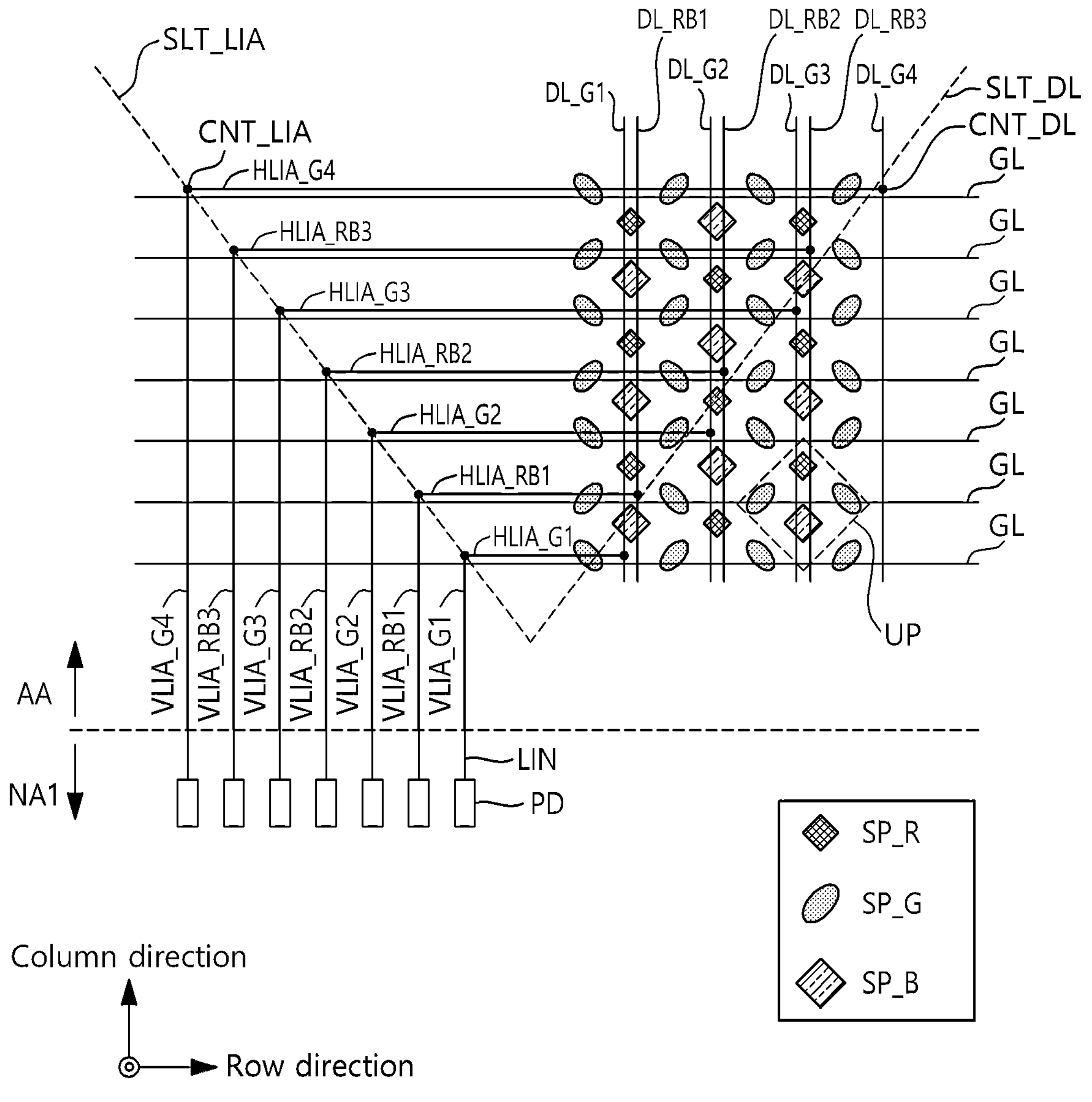
FIG. 6 illustrates in more detail a data link structure for reducing a bezel of a display panel according to embodiments of the present disclosure.

FIG. 6 illustrates in more detail a data link structure for reducing a bezel of a display panel 110 according to embodiments of the present disclosure. Hereinafter, FIG. 5 will be referred to together in the description.

Referring to FIG. 6, the plurality of subpixels SP disposed on the display panel 110 may include a plurality of first color subpixels SP_G emitting first color light, a plurality of second color subpixels SP_R emitting second color light, and a plurality of third color subpixels SP_B emitting third color light.

In FIG. 6, a plurality of first color subpixels SP_G, a plurality of second color subpixels SP_R, and a plurality of third color subpixels SP_B may represent light emitting areas or emission areas. That is, in FIG. 6, a plurality of first color subpixels SP_G, a plurality of second color subpixels SP_R, and a plurality of third color subpixels SP_B may represent light emitting devices ED. In the following drawings, it is exemplified a case in which a plurality of first color subpixels SP_G, a plurality of second color subpixels SP_R, and a plurality of third color subpixels SP_B may correspond the light emitting devices or emission areas formed by light emitting devices EDs.

Referring to FIG. 6, two first color subpixels SP_G, one second color subpixel SP_R and one third color subpixel SP_B may form one unit pixel UP. That is, the display panel 110 may include a plurality of unit pixels UP, and each of the plurality of unit pixels UP may include two first color subpixels SP_G, one second color subpixel SP_R, and one third color subpixel SP_B.

Referring to FIG. 6, each of the plurality of unit pixels UP may have a diamond shape.

Referring to FIG. 6, the plurality of first color subpixels SP_G may be arranged in the row direction (e.g., horizontal direction). The plurality of second color subpixels SP_R and the plurality of third color subpixels SP_B may be arranged alternately one by one in the row direction (e.g., horizontal direction).

Referring to FIG. 6, the plurality of data lines DL may include a plurality of first color data lines DL_G1, DL_G2, DL_G3 and DL_G4 for supplying data voltages to the first color subpixels SP_G arranged in the column direction (e.g., vertical direction), and a plurality of integrated data lines DL_RB1, DL_RB2 and DL_RB3 for alternately supplying data voltages to the second color subpixels SP_R and third color subpixels SP_B arranged alternately in the column direction (e.g., vertical direction).

Referring to FIG. 6, a plurality of first color data lines DL_G1, DL_G2, DL_G3 and DL_G4 and a plurality of integrated data lines DL_RB1, DL_RB2 and DL_RB3 may be arranged alternately one by one in the row direction (e.g., horizontal direction).

Referring to FIG. 6, a plurality of gate lines GL may be arranged in the row direction (e.g., horizontal direction). For example, a plurality of gate lines GL may overlap with a plurality of first color subpixels SP_G.

Referring to FIG. 6, the data link structure of the display panel 110 according to embodiments of the present disclosure may include vertical link lines VLIA_G1, VLIA_G2, VLIA_G3, VLIA_G4, VLIA_RB1, VLIA_RB2 and VLIA_RB3, and horizontal link lines HLIA_G1, HLIA_G2, HLIA_G3, HLIA_G4, HLIA_RB1 HLIA_RB2 and HLIA_RB3.

Referring to FIG. 6, each of the vertical link lines VLIA_G1, VLIA_G2, VLIA_G3, VLIA_G4, VLIA_RB1 and VLIA_RB2, VLIA_RB3 may be arranged to extend in the column direction (e.g., vertical direction). Each of the horizontal link lines HLIA_G1, HLIA_G2, HLIA_G3, HLIA_G4, HLIA_RB1, HLIA_RB2 and HLIA_RB3 may be arranged to extend in the row direction (e.g., horizontal direction).

Referring to FIG. 6, the vertical link lines VLIA_G1, VLIA_G2, VLIA_G3, VLIA_G4, VLIA_RB1, VLIA_RB2 and VLIA_RB3 may electrically connect the non-active area link lines LIN disposed in the first non-active area NA1 and the horizontal link lines HLIA_G1, HLIA_G2, HLIA_G3, HLIA_G4, HLIA_RB1, HLIA_RB2 and HLIA_RB3 disposed in the active area AA.

Referring to FIG. 6, horizontal link lines HLIA_G1, HLIA_G2, HLIA_G3, HLIA_G4, HLIA_RB1, HLIA_RB2 and HLIA_RB3 may electrically connect the vertical link lines VLIA_G1, VLIA_G2, VLIA_G3, VLIA_G4, VLIA_RB1, VLIA_RB2 and VLIA_RB3, and the data lines DL_G1, DL_G2, DL_G3, DL_G4, DL_RB1, DL_RB2 and DL_RB3.

Referring to FIG. 6, the horizontal link lines HLIA_G1, HLIA_G2, HLIA_G3, HLIA_G4, HLIA_RB1, HLIA_RB2 and HLIA_RB3 may be disposed for one or two pixel lines. That is, one horizontal link line may be arranged to correspond to one or two pixel lines.

Referring to FIG. 6, each of the horizontal link lines HLIA_G1, HLIA_G2, HLIA_G3, HLIA_G4, HLIA_RB1, HLIA_RB2, and HLIA_RB3 may be arranged to correspond to one gate line GL. That is, a corresponding horizontal link line may exist in each of the plurality of gate lines GL.

Referring to FIG. 6, the link line connection holes CNT_LIA where the horizontal link lines HLIA_G1, HLIA_G2, HLIA_G3, HLIA_G4, HLIA_RB1, HLIA_RB2 and HLIA_RB3 and the vertical link lines VLIA_G1, VLIA_G2, VLIA_G3, VLIA_G4, VLIA_RB1, VLIA_RB2 and VLIA_RB3 are electrically connected may form a second slant line SLT_LIA.

Referring to FIG. 6, the data line connection holes CNT_DL where the horizontal link lines HLIA_G1, HLIA_G2, HLIA_G3, HLIA_G4, HLIA_RB1, HLIA_RB2 and HLIA_RB3 and data lines DL_G1, DL_G2, DL_G3, DL_G4, DL_RB1, DL_RB2 and DL_RB3 are electrically connected may form a first slant line SLT_DL.

As described above, crosstalk between the gate lines GL and the horizontal link lines HLIA may cause an abnormal image phenomenon at or near the first slant line SLT_DL formed by the data line connection holes CNT_DL where the data lines DL and the horizontal link lines HLIA are connected. For example, due to "slant line crosstalk" occurring near the first slant line SLT_DL, slanted dark lines and/or bright lines may appear as an image abnormality.

Accordingly, the display device 100 and the display panel 110 according to embodiments of the present disclosure may include a data link structure capable of mitigating the slant line crosstalk. Hereinafter, it will be described a data link structure for mitigating the slant line crosstalk according to embodiments of the present disclosure. Hereinafter, in the description, description of the same content as in FIG. 6 will be omitted.

Figure 7:
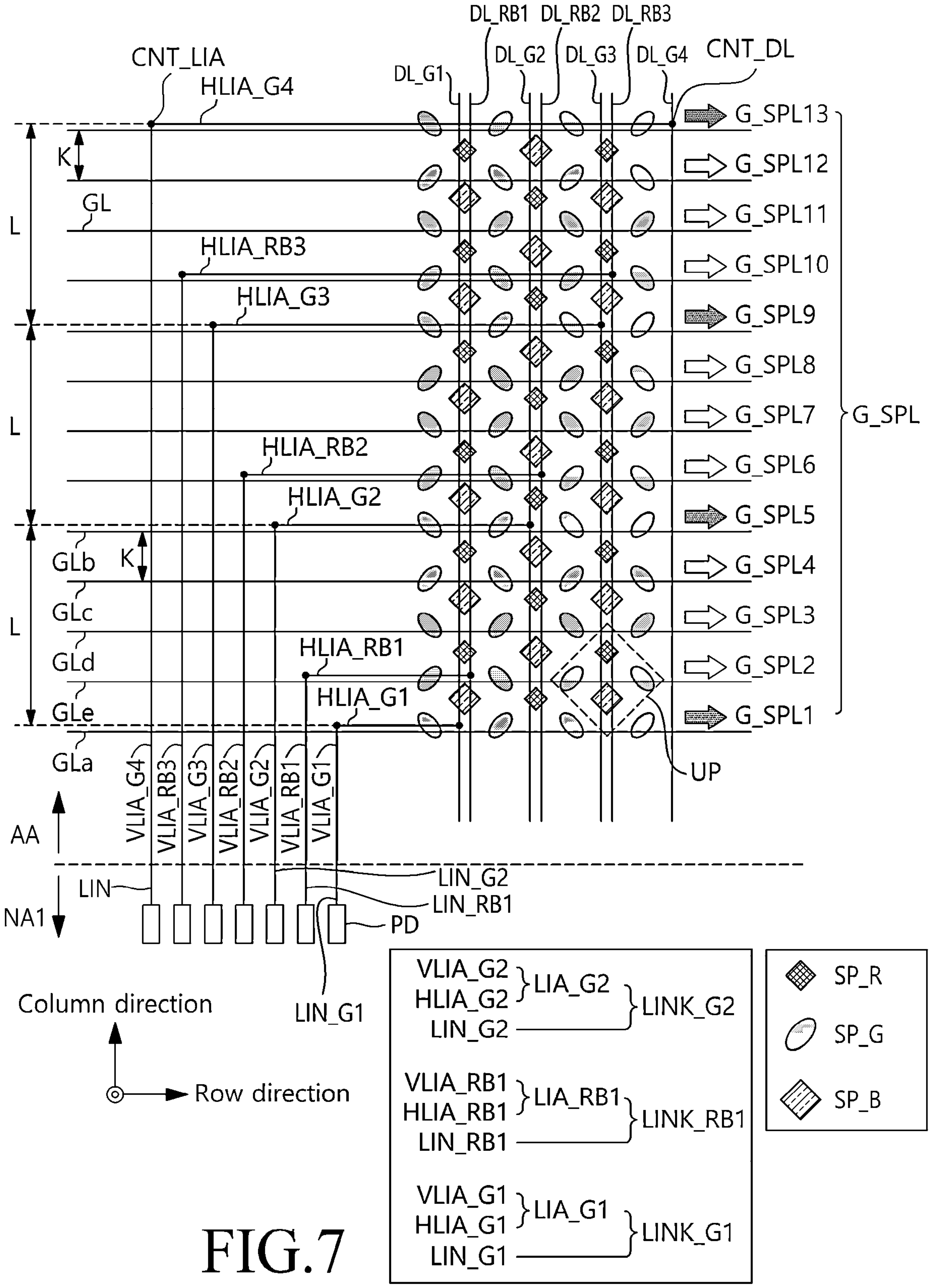
FIG. 7 illustrates a data link structure for mitigating the slant line crosstalk phenomenon of a display panel according to embodiments of the present disclosure.
Figure 8:
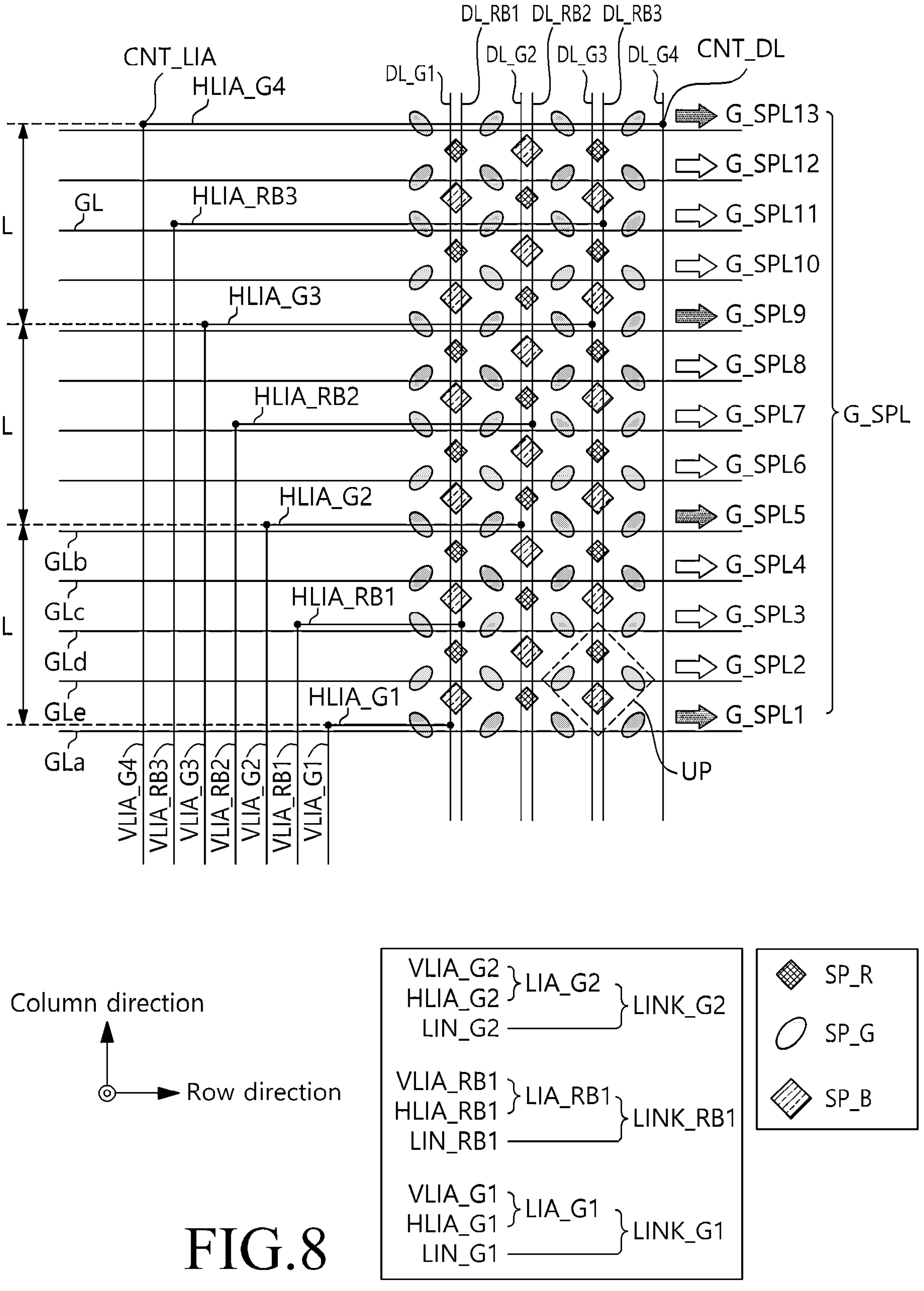
FIG. 8 illustrates another data link structure for mitigating a slant line crosstalk phenomenon of a display panel according to embodiments of the present disclosure.

FIGS. 7 and 8 illustrate a data link structure for mitigating the slant line crosstalk phenomenon of a display panel 110 according to embodiments of the present disclosure. Hereinafter, FIG. 5 will be referred to together in the description.

Referring to FIGS. 7 and 8, the plurality of subpixels SP disposed on the display panel 110 may include a plurality of first color subpixels SP_G emitting first color light, a plurality of second color subpixels SP_R emitting second color light, and a plurality of third color subpixels SP_B emitting third color light. For example, the first color light may be green light, the second color light may be red light, and the third color light may be blue light.

In FIGS. 7 and 8, a plurality of first color subpixels SP_G, a plurality of second color subpixels SP_R and a plurality of third color subpixels SP_B may represent light emitting areas or emission areas. That is, in FIG. 7, the plurality of first color subpixels SP_G, the plurality of second color subpixels SP_R and the plurality of third color subpixels SP_B may represent light emitting devices ED.

Referring to FIGS. 7 and 8, two first color subpixels SP_G, one second color subpixel SP_R and one third color subpixel SP_B may constitute one unit pixel. In other words, the display panel 110 may include a plurality of unit pixels UP, and each of the plurality of unit pixels UP may include two first color subpixels SP_G, one second color subpixel SP_R and one third color subpixel SP_B.

Referring to FIGS. 7 and 8, each of the plurality of unit pixels UP may have a diamond shape.

Referring to FIGS. 7 and 8, the plurality of first color subpixels SP_G may be arranged in the row direction (e.g., horizontal direction). The plurality of second color subpixels SP_R and the plurality of third color subpixels SP_B may be arranged alternately one by one in the row direction (e.g., horizontal direction).

Referring to FIGS. 7 and 8, the plurality of data lines DL may include a plurality of first colors data lines DL_G1, DL_G2, DL_G3 and DL_G4 for supplying data voltages to the first color subpixels SP_G arranged in the column direction (e.g., vertical direction), and a plurality of integrated data lines DL_RB1, DL_RB2 and DL_RB3 for alternately supplying data voltages to the second color subpixels SP_R and third color subpixels SP_B arranged alternately in the column direction (e.g., vertical direction).

Referring to FIGS. 7 and 8, a plurality of first color data lines DL_G1, DL_G2, DL_G3 and DL_G4 and a plurality of integrated data lines DL_RB1, DL_RB2 and DL_RB3 may be alternately arranged one by one in the row direction (e.g., horizontal direction).

Referring to FIGS. 7 and 8, a plurality of gate lines GL may be arranged in the row direction (e.g., horizontal direction). For example, a plurality of gate lines GL may overlap a plurality of first color subpixels SP_G. Each of the plurality of gate lines GL may be disposed to correspond to one unit pixel UP. Referring to FIG. 7, the data link structure of the display panel 110 according to embodiments of the present disclosure may include the vertical link lines VLIA_G1, VLIA_G2, VLIA_G3, VLIA_G4, VLIA_RB1, VLIA_RB2 and VLIA_RB3, and the horizontal link lines HLIA_G1, HLIA_G2, HLIA_G3, HLIA_G4, HLIA_RB1, HLIA_RB2 and HLIA_RB3.

Referring to FIGS. 7 and 8, each of the vertical link lines VLIA_G1, VLIA_G2, VLIA_G3, VLIA_G4, VLIA_RB1, VLIA_RB2 and VLIA_RB3 may be disposed to extend in the column direction (e.g., vertical direction). Each of the horizontal link lines HLIA_G1, HLIA_G2, HLIA_G3, HLIA_G4, HLIA_RB1, HLIA_RB2 and HLIA_RB3 may be arranged to extend in the row direction (e.g., horizontal direction).

Referring to FIGS. 7 and 8, the vertical link lines VLIA_G1, VLIA_G2, VLIA_G3, VLIA_G4, VLIA_RB1, VLIA_RB2 and VLIA_RB3 may electrically connect the non-active area link lines LIN disposed in the first non-active area NA1 and the horizontal link lines HLIA_G1, HLIA_G2, HLIA_G3, HLIA_G4, HLIA_RB1, HLIA_RB2 and HLIA_RB3 disposed in the active area AA.

Referring to FIGS. 7 and 8, the horizontal link lines HLIA_G1, HLIA_G2, HLIA_G3, HLIA_G4, HLIA_RB1, HLIA_RB2 and HLIA_RB3 may electrically connect the vertical link lines VLIA_G1, VLIA_G2, VLIA_G3, VLIA_G4, VLIA_RB1, VLIA_RB2 and VLIA RB3, and the data lines DL_G1, DL_G2, DL_G3, DL_G4, DL_RB1, DL_RB2 and DL_RB3.

Referring to FIGS. 7 and 8, when the display panel 110 according to embodiments of the present disclosure has a data link structure, the horizontal link lines HLIA_G1, HLIA_G2, HLIA_G3, HLIA_G4, HLIA_RB1, HLIA_RB2 and HLIA_RB3 may not be arranged for each pixel line. That is, there may not be a horizontal link line corresponding to at least one of the plurality of pixel lines, and there may be a horizontal link line corresponding to only some of the plurality of pixel lines.

Referring to FIGS. 7 and 8, each of the horizontal link lines HLIA_G1, HLIA_G2, HLIA_G3, HLIA_G4, HLIA_RB1, HLIA_RB2 and HLIA_RB3 may be disposed to correspond to one gate line GL. However, at least one of the plurality of gate lines GL (GLc and GLd in FIG. 7, GLc and GLe in FIG. 8) may not have a corresponding horizontal link line.

The display panel 110 of the display device 100 according to embodiments of the present disclosure may include a substrate 111 including an active area AA capable of displaying an image and a non-active area NA located outside the active area AA and including a pad area PA, a plurality of data lines DL disposed in the active area AA and each extending in a column direction, a plurality of gate lines GL arranged in the active area AA and each extending in a row direction, and a plurality of link lines LINK electrically connecting a plurality of pads PD disposed in the pad area PA and a plurality of data lines DL.

Each of the plurality of link lines LINK may include a horizontal link line HLIA extending in the row direction and a vertical link line VLIA extending in the column direction.

The horizontal link line HLIA included in each of the plurality of link lines LINK may be disposed in the active area AA, and at least a portion of the vertical linkline VLIA included in each of the plurality of link lines LINK may be disposed in the active area AA.

Referring to FIGS. 7 and 8, the plurality of link lines LINK may include a first link line LINK_G1 electrically connected to a first data line DL_G1 among the plurality of data lines DL, and a second link line LINK_G2 electrically connected to a second data line DL_G2 different from the first data line DL_G1 among the plurality of data lines DL.

Referring to FIGS. 7 and 8, the first link line LINK_G1 may include a first line LIA_G1 disposed in the active area AA and a second line LIN_G1 disposed in the first non-active area NA1. The first line LIA_G1 may include a first vertical link line VLIA_G1 and a first horizontal link line HLIA_G1. The second link line LINK_G2 may include a third line LIA_G2 disposed in the active area AA and a fourth line LIN_G2 disposed in the first non-active area NA1. The third line LIA_G2 may include a second vertical link line VLIA_G2 and a second horizontal link line HLIA_G2.

Referring to FIGS. 7 and 8, the plurality of subpixels SP may include a plurality of first color subpixels SP_G emitting the first color light among the plurality of color lights. An emission area of each of the plurality of first color subpixels SP_G may be disposed in a plurality of first color subpixel lines G_SPL (i.e., G_SPL1 to G_SPL13).

Referring to FIGS. 7 and 8, the first horizontal link line HLIA_G1 may correspond to one first color subpixel line G_SPL1 among the plurality of first color subpixel lines G_SPL1 to G_SPL13. In addition, the second horizontal link line HLIA_G2 may correspond to another first color subpixel line G_SPL5 among the plurality of first color subpixel lines G_SPL1 to G_SPL13.

Referring to FIGS. 7 and 8, the plurality of first color subpixel lines G_SPL1 to G_SPL13 may include two or more another first color subpixel lines G_SPL2, G_SPL3 and G_SPL4 disposed between one first color subpixel line G_SPL1 and another first color subpixel line G_SPL5.

The active area AA may include a central area Ac, a first area A1 and a second area A2, and the first area A1 may be located on one side of the central area Ac in the row direction, and the second area A2 may be located on the other side of the central area in the row direction (see FIG. 5).

The first data line DL_G1 and the second data line DL_G2 both may be located in either the first area A1 or the second area A2 located on one side of the central area Ac.

Referring to FIGS. 7 and 8, the first vertical link line VLIA_G1 may be electrically connected to the first pad PD of the plurality of pads PD, and the first horizontal link line HLIA_G1 may electrically connect the first vertical link line VLIA_G1 and the first data line DL_G1.

Referring to FIGS. 7 and 8, the second vertical link line VLIA_G2 may be electrically connected to the second pad PD of the plurality of pads PD, and the second horizontal link line HLIA_G2 may electrically connect the second vertical link line VLIA_G2 and the second data line DL_G2.

Referring to FIGS. 7 and 8, the first data line DL_G1 may supply a first data voltage to one first color subpixel SP_G among the first color subpixels SP_G included in one first color subpixel line G_SPL1.

Referring to FIGS. 7 and 8, the second data line DL_G2 may supply a second data voltage to one of the first color subpixels SP_G included in another first color subpixel line G_SPL5.

Referring to FIGS. 7 and 8, the plurality of gate lines GL may include at least one first gate line GLa corresponding to the first horizontal link line HLIA_G1, and at least one second gate line GLb corresponding to the second horizontal link line HLIA_G2.

Referring to FIGS. 7 and 8, at least a portion of the first horizontal link line HLIA_G1 may overlap with at least one first gate line GLa, and at least a portion of the second horizontal link line HLIA_G2 may overlap with at least one second gate line GLb.

Referring to FIGS. 7 and 8, a length of the first horizontal link line HLIA_G1 may be shorter than a length of the second horizontal link line HLIA_G2, and a length of the first vertical link line VLIA_G1 may be shorter than a length of the second vertical link line VLIA_G2.

The plurality of subpixels SP may further include a plurality of second color subpixels SP_R emitting a second color light among the plurality of color lights, and a plurality of third color subpixels SP_B emitting a third color light among the plurality of color lights The plurality of second color subpixels SP_R may include at least one second color subpixel SP_R disposed between one first color subpixel line G_SPL1 and another first color subpixel line G_SPL5.

The plurality of third color subpixels SP_B may include at least one third color subpixel SP_B disposed between one first color subpixel line G_SPL1 and another first color subpixel line G_SPL5.

At least one second color subpixel SP_R and at least one third color subpixel SP_B may be arranged adjacent to each other in the column direction (or row direction).

The plurality of data lines DL may include a third data line DL_RB1 for alternately supplying data voltages to at least one second color subpixel SP_R and at least one third color subpixel SP_B.

The plurality of link lines LINK may further include a third link line LINK_RB1 electrically connected to the third data line DL_RB1. The third link line LINK_RB1 may include a fifth line LIA_RB1 disposed in the active area AA and a sixth line LIN_RB1 disposed in the first non-active area NA1. The fifth line LIA_RB1 may include a third vertical link line VLIA_RB1 extending in the vertical direction and a third horizontal link line HLIA_RB1 extending in the horizontal direction.

The third vertical link line VLIA_RB1 may be electrically connected to a third pad PD of the plurality of pads PD, and the third horizontal link line HLIA_RB1 may electrically connect the third vertical link line VLIA_RB1 and the third data line DL_RB1.

Referring to FIGS. 7 and 8, the third horizontal link line HLIA_RB1 may be disposed between the first horizontal link line HLIA_G1 and the second horizontal link line HLIA_G2.

Referring to FIG. 7, the third horizontal link line HLIA_RB1 may be disposed closer to the first horizontal link line HLIA_G1 among the first horizontal link line HLIA_G1 and the second horizontal link line HLIA_G2.

Referring to FIG. 8, the third horizontal link line HLIA_RB1 may be disposed closer to the second horizontal link line HLIA_G2 among the first horizontal link line HLIA_G1 and the second horizontal link line HLIA_G2.

The plurality of subpixels SP may include a plurality of unit pixels UP, and each of the plurality of unit pixels UP may include two first color subpixels SP_G, one second color subpixel SP_R, and one third color subpixel SP_B.

At least one of the horizontal link line HLIA and the gate line GL may be disposed below the two first color subpixels SP_G among the two first color subpixels SP_G, one second color subpixel SP_R and one third color subpixel SP_B.

Among the two first color subpixels SP_G, one second color subpixel SP_R and one third color subpixel SP_B, the two first color subpixels SP_G may overlap with at least one of the horizontal link line HLIA and the gate line GL.

Referring to FIGS. 7 and 8, horizontal link lines HLIA_G1, HLIA_G2, HLIA_G3 and HLIA_G4 connected to the data lines DL_G1, DL_G2, DL_G3 and DL_G4 for supplying data voltage to the first color subpixels SP_G may be separated by a predetermined distance L. For example, the first horizontal link line HLIA_G1 and the second horizontal link line HLIA_G2 may be spaced apart by a predetermined distance L.

Referring to FIGS. 7 and 8, the predetermined distance L may be greater than twice the spacing between two adjacent first color subpixel lines G_SPL among the first color subpixel lines G_SPL1 to G_SPL13. Here, the spacing between two adjacent first color subpixel lines G_SPL may correspond to a spacing K between two adjacent gate lines GL.

Referring to FIGS. 7 and 8, the distance L between the first horizontal link line HLIA_G1 and the second horizontal link line HLIA_G2 may be greater than twice the spacing K of two adjacent gate lines GL (i.e., $L>2*K$).

Referring to FIGS. 7 and 8, the third horizontal link line HLIA_RB1 may be disposed anywhere between the first horizontal link line HLIA_G1 and the second horizontal link line HLIA_G2.

Referring to FIGS. 7 and 8, the display panel 110 according to embodiments of the present disclosure may include an active area AA capable of displaying images, a non-active area NA located outside the active area AA and including a pad area PA, a first pad PD disposed in the pad area PA, a first data line DL_G1 disposed in the active area AA and extending in a column direction, a first horizontal link line HLIA_G1 disposed in the active area AA, extending in a row direction, and electrically connected to the first data line DL_G1, and a first vertical link line VLIA_G1 disposed in the active area AA, extending in the column direction, and electrically connecting the first horizontal link line HLIA_G1 and the first pad PD.

Referring to FIGS. 7 and 8, the display panel 110 according to embodiments of the present disclosure may further include a second pad PD disposed in the pad area PA, a second data line DL_G2 disposed in the active area AA and extending in the column direction, a second horizontal link line HLIA_G2 disposed in the active area AA, extending in the row direction and electrically connected to the second data line DL_G2, and a second vertical link line VLIA_G2 disposed in the active area AA, extending in the column direction and electrically connecting the second horizontal link line HLIA_G2 and the second pad PD.

Referring to FIGS. 7 and 8, the display panel 110 according to embodiments of the present disclosure may further include a first subpixels SP_G connected to the first data line DL_G1 and emitting first color light, a second subpixels SP_G connected to the second data line DL_G2 and emitting the first color light, and two or more third subpixels SP_G emitting the first color light, connected to the first data line DL_G1, and disposed between the first horizontal link line HLIA_G1 and the second horizontal link line HLIA_G2.

Referring to FIGS. 7 and 8, the display panel 110 according to embodiments of the present disclosure may further include two or more fourth subpixels SP_G which emits the first color light, is connected to the second data line DL_G2, and is disposed between the first horizontal link line HLIA_G1 and the second horizontal link line HLIA_G2.

Referring to FIGS. 7 and 8, the display panel 110 according to embodiments of the present disclosure may further include a third pad PD disposed in the pad area PA, a third data line DL_RB1 disposed in the active area AA and extending in the column direction, a third horizontal link line HLIA_RB1 disposed in the active area AA, extending in the row direction, and electrically connected to the third data line DL_RB1, and a third vertical link line VLIA_RB1 disposed in the active area AA, extending in the column direction, and electrically connecting the third horizontal link line HLIA_RB1 and the third pad PD.

The subpixels SP_R and SP_B connected to the third data line DL_RB1 may emit a second color light (e.g., red light or blue light) different from the first color light, and the third horizontal link line HLIA_RB1 may be disposed between the first horizontal link line HLIA_G1 and the second horizontal link line HLIA_G2.

Referring to FIGS. 7 and 8, the display panel 110 according to embodiments of the present disclosure may further include at least one first gate line GLa corresponding to the first horizontal link line HLIA_G1, and at least one second gate line GLb corresponding to the second horizontal link line HLIA_G2.

Referring to FIGS. 7 and 8, at least a portion of the first horizontal link line HLIA_G1 may overlap with at least one first gate line GLa, and at least a portion of the second horizontal link line HLIA_G2 may overlap with at least one second gate line GLb.

The active area AA may include a central area Ac, a first area A1, and a second area A2 adjacent to each other in the row direction. The first area A1 may be located on one side of the central area Ac. The second area A2 may be located on the other side of the central area Ac.

Both the first data line DL_G1 and the second data line DL_G2 may be located in either the first area A1 or the second area A2. That is, both the first data line DL_G1 and the second data line DL_G2 may be located in the first area A1. Both the first data line DL_G1 and the second data line DL_G2 may be located in the second area A2.

Referring to FIGS. 7 and 8, the display panel 110 according to embodiments of the present disclosure may include an active area AA capable of displaying images, a non-active area NA located outside the active area AA and including a pad area PA, a first pad PD disposed in the pad area PA, a first data line DL_G1 disposed in the active area AA and extending in a column direction, a first horizontal link line HLIA_G1 disposed in the active area AA, extending in a row direction, and electrically connected to the first data line DL_G1, and a first vertical link line VLIA_G1 disposed in the active area AA, extending in the column direction, and electrically connecting the first horizontal link line HLIA_G1 and the first pad PD.

Referring to FIGS. 7 and 8, the display panel 110 according to embodiments of the present disclosure may further include a first gate line GLa arranged to overlap the first horizontal link line HLIA_G1, a second pad PD disposed in the pad area PA, a second data line DL_G2 disposed in the active area AA and extending in the column direction, a second horizontal link line HLIA_G2 disposed in the active area AA, extending in the row direction, and electrically connected to the second data line DL_G2, a second vertical link line VLIA_G2 disposed in the active area AA, extending in the column direction and electrically connecting the second horizontal link line HLIA_G2 and the second pad PD, and a second gate line GLb disposed to overlap the second horizontal link line HLIA_G2.

Referring to FIGS. 7 and 8, the display panel 110 according to embodiments of the present disclosure may further include an intermediate gate line (GLc and GLd in FIG. 7, GLc and GLe in FIG. 8) which is disposed between the first gate line GLa and the second gate line GLb and does not have an overlapping horizontal link line HLIA.

Referring to FIGS. 7 and 8, the display panel 110 according to embodiments of the present disclosure may further include a third pad PD disposed in the pad area, a third data line DL_RB1 disposed in the active area and extending in the column direction, a third horizontal link line HLIA_RB1 disposed in the active area, extending in the row direction, and electrically connected to the third data line DL_RB1, a third vertical link line VLIA_RB1 disposed in the active area, extending in the column direction and electrically connecting the third horizontal link line HLIA_RB1 and the third pad PD, and a third gate line (GLe in FIG. 7, GLd in FIG. 8) overlapping with the third horizontal link line HLIA_RB1.

Referring to FIGS. 7 and 8, in the display panel 110 according to embodiments of the present disclosure, the third horizontal link line HLIA_RB1 may be disposed between the first horizontal link line HLIA_G1 and the second horizontal link line HLIA_G2.

Referring to FIGS. 7 and 8, the third gate line (GLe in FIG. 7, GLd in FIG. 8) may be disposed between the first gate line GLa and the second gate line GLb.

Figure 9:
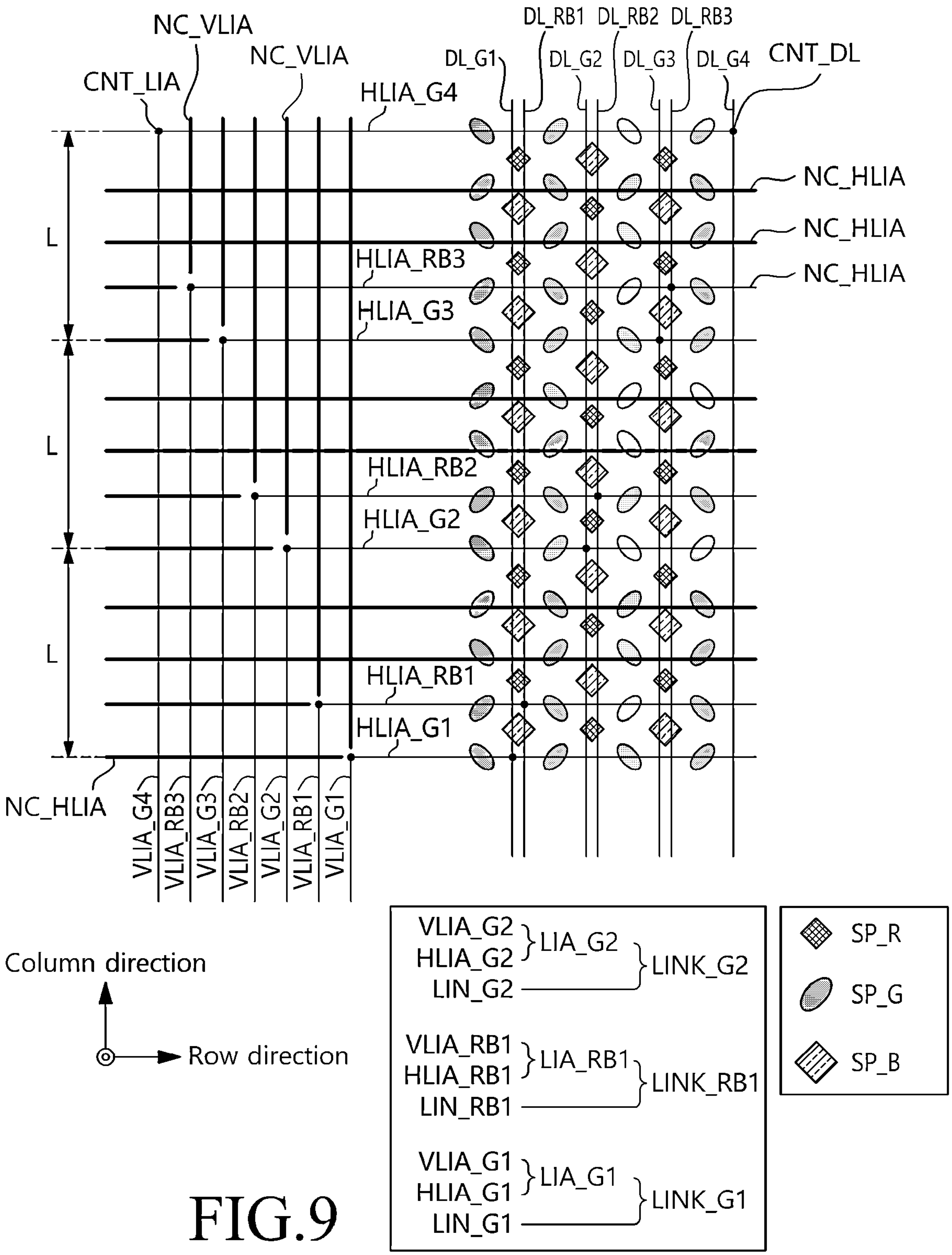
FIG. 9 illustrates another data link structure for mitigating the slant line crosstalk phenomenon of a display panel according to embodiments of the present disclosure.
Figure 10:
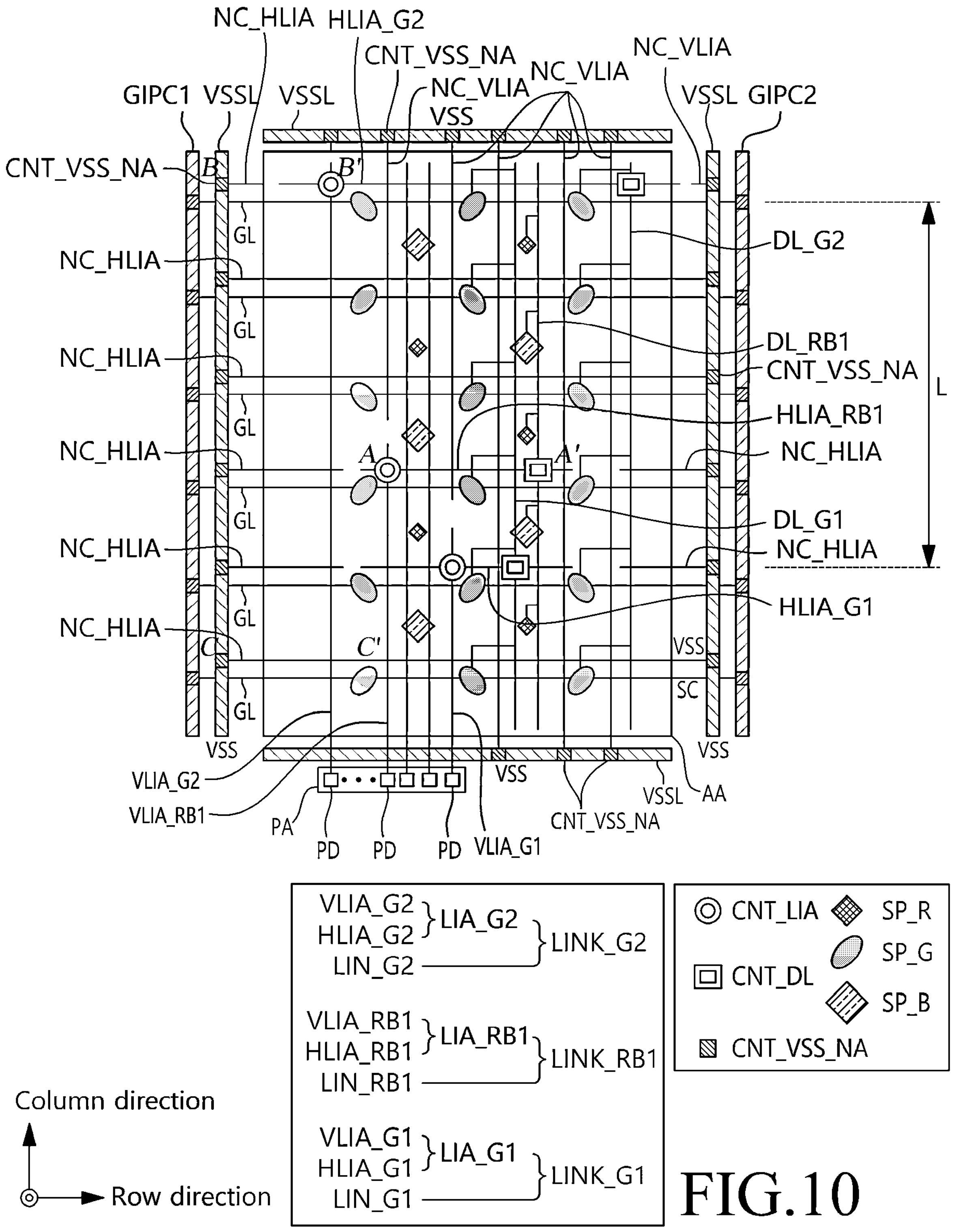
FIG. 10 illustrates another data link structure for mitigating the slant line crosstalk phenomenon of a display panel according to embodiments of the present disclosure.
Figure 11:
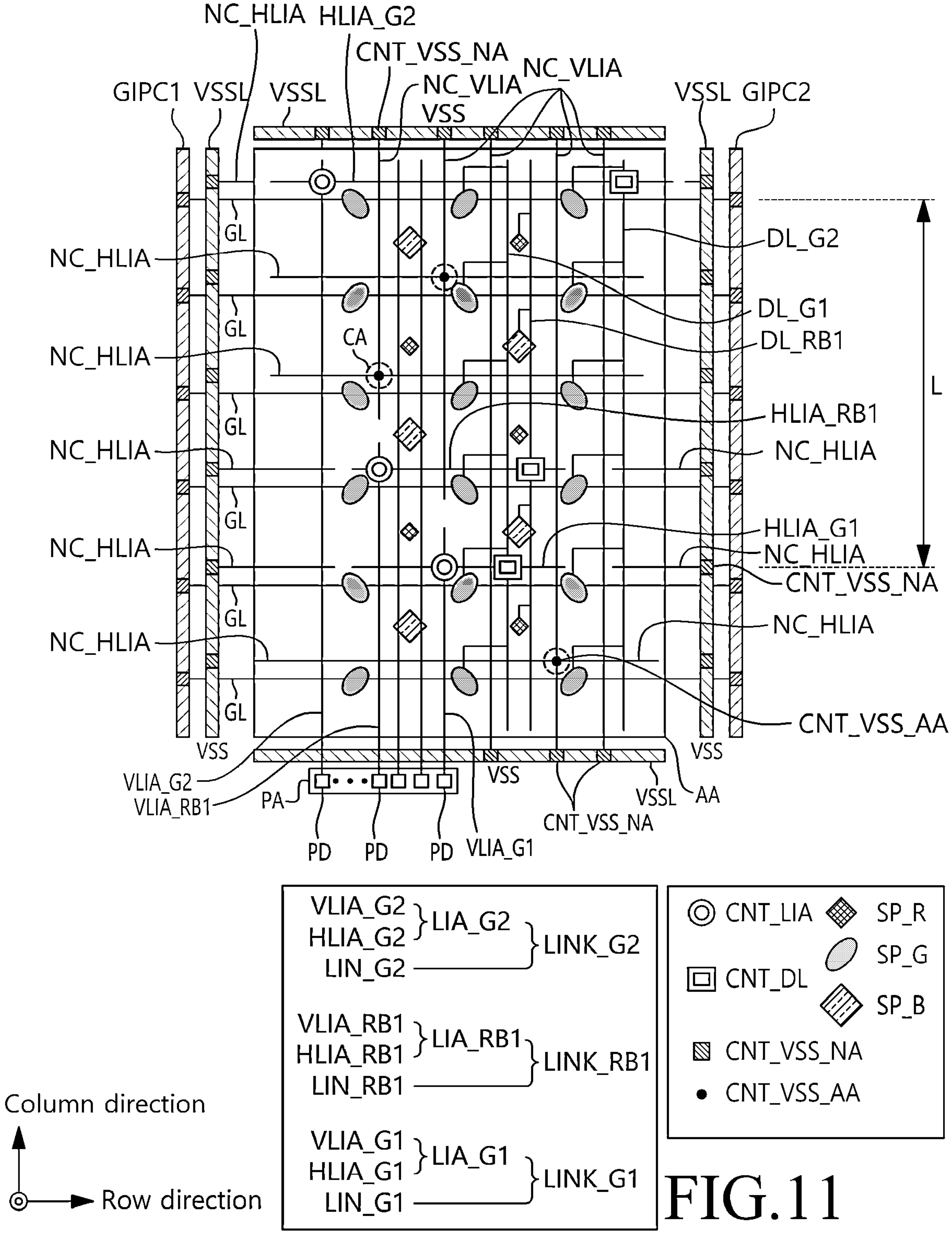
FIG. 11 illustrates another data link structure for mitigating the slant line crosstalk phenomenon of a display panel according to embodiments of the present disclosure.

FIG. 9 illustrates another data link structure for mitigating the slant line crosstalk phenomenon of a display panel 110 according to embodiments of the present disclosure, FIG. 10 illustrates another data link structure for mitigating the slant line crosstalk phenomenon of a display panel 110 according to embodiments of the present disclosure, and FIG. 11 illustrates another data link structure for mitigating the slant line crosstalk phenomenon of a display panel 110 according to embodiments of the present disclosure. FIGS. 10 and 11 are diagrams illustrating a portion of FIG. 9 in detail. However, hereinafter, description of the same content as previously described may be omitted.

Referring to FIGS. 10 and 11, the display panel 110 according to embodiments of the present disclosure may include a gate driving panel circuit GIPC1 and GIPC2 disposed in the non-active area NA), which is an area outside the active area AA.

Referring to FIGS. 10 and 11, the gate driving panel circuit GIPC1 and GIPC2 may be a circuit for outputting a scan signal SC to gate lines GL as scan lines SCL, and may be a gate driving circuit 130 of the gate-in-panel (GIP) type.

Referring to FIGS. 9 to 11, the display panel 110 according to embodiments of the present disclosure may further include a horizontal metal line NC_HLIA which is disposed to extend in the row direction in the same way as the first horizontal link line HLIA_G1, is located in a first metal layer in the same way as the first horizontal link line HLIA_G1, and is spaced apart from the first horizontal link line HLIA_G1.

Referring to FIGS. 9 to 11, the horizontal metal line NC_HLIA and the first horizontal link line HLIA_G1 may be metals formed together by patterning within the first metal layer. Even though the horizontal metal line NC_HLIA and the first horizontal link line HLIA_G1 are formed together in the first metal layer, they may be electrically separated.

Referring to FIGS. 10 to 11, the horizontal metal line NC_HLIA may be electrically floating or electrically connected to a common driving voltage line (e.g., VSSL).

Even though the horizontal metal line NC_HLIA and the first horizontal link line HLIA_G1 are formed together in the first metal layer, they may have different voltage states.

A data signal (i.e., data voltage) is applied to the first horizontal link line HLIA_G1, but the horizontal metal line NC_HLIA may be in a floating state in which no electrical voltage or signal is applied, or may be a state in which a signal (or voltage) completely different from the data signal (or data voltage) is applied.

When a completely different signal (or voltage) from the data signal (or data voltage) is applied to the horizontal metal line NC_HLIA, for example, a signal that can vary depending on the image or driving state (e.g., data signal, gate signal, etc.) is not applied to the horizontal metal line NC_HLIA, and a common driving voltage that does not vary depending on the image or driving state may be applied to the horizontal metal line NC_HLIA.

For example, the common driving voltage may include a first common driving voltage VDD and a second common driving voltage VSS. In this case, the display panel 110 may include common driving voltage lines VDDL and VSSL to supply the common driving voltage.

For example, as shown in FIGS. 10 to 11, the second common driving voltage VSS may be applied to the horizontal metal line NC_HLIA. In this case, the display panel 110 may further include a second common driving voltage line VSSL for supplying the second common driving voltage VSS to the cathode CAT corresponding to the common electrode.

When the horizontal metal line NC_HLIA is electrically connected to the second common driving voltage line VSSL for transmitting the second common driving voltage VSS, the connection position between the horizontal metal line NC_HLIA and the second common driving voltage line VSSL may be located in a non-active area NA as shown in FIG. 10, or may be located in an active area AA as shown in FIG. 11.

Referring to FIG. 10, the horizontal metal line NC_HLIA may be electrically connected to the second common driving voltage line VSSL disposed in the non-active area NA through an outer common voltage contact hole CNT_VSS_NA located in the non-active area NA. That is, the horizontal metal line NC_HLIA may be electrically connected to the second common driving voltage line VSSL in the non-active area NA.

Referring to FIG. 11, the horizontal metal line NC_HLIA may be electrically connected to the second common driving voltage line VSSL disposed in the non-active area NA through an internal common voltage contact hole CNT_VSS_AA located in the active area AA. That is, the horizontal metal line NC_HLIA may be electrically connected to the second common driving voltage line VSSL in the active area AA.

In this case, as shown in FIG. 11, the horizontal metal line NC_HLIA may be electrically connected to a second common driving voltage line VSSL disposed in the non-active area NA through the outer common voltage contact hole CNT_VSS_NA located in the non-active area NA.

Referring to FIGS. 9 to 11, the display panel 110 according to embodiments of the present disclosure may further include a vertical metal line NC_VLIA which is disposed to extend in the column direction (e.g., vertical direction) in the same manner as the first vertical link line VLIA_G1, is located in a second metal layer in the same manner as the first vertical link line VLIA_G1, and is spaced apart from the first vertical link line VLIA_G1.

Referring to FIGS. 9 to 11, the vertical metal line NC_VLIA may be configured in the same way as the horizontal metal line NC_HLIA as described above. However, the vertical metal line NC_VLIA may be disposed on a second metal layer that is different from the first metal layer on which the horizontal metal line NC_HLIA is disposed. Here, the second metal layer may be located on the first metal layer.

Referring to FIGS. 9 to 11, the vertical metal line NC_VLIA may be electrically connected to the second common driving voltage line VSSL in the same manner as the horizontal metal line NC_HLIA.

Referring to FIGS. 9 to 11, the vertical metal line NC_VLIA may be electrically floating or may be electrically connected to the common driving voltage line VSSL.

Even though the vertical metal line NC_VLIA and the first vertical link line VLIA_G1 are formed together in the second metal layer, they may have different voltage states.

A data signal (or data voltage) is applied to the first vertical link line VLIA_G1, but the vertical metal line NC_VLIA may be in a floating state in which no electrical voltage or signal is applied, or may be a state in which a signal (or voltage) completely different from the data signal (or data voltage) is applied.

When a signal (or voltage) completely different from the data signal (or data voltage) is applied to the vertical metal line NC_VLIA, for example, a signal that can vary depending on the image or driving state (e.g., data signal, gate signal) may be not applied to the vertical metal line NC_VLIA), and a common driving voltage that does not vary depending on the image or driving state may be applied to the vertical metal line NC_VLIA.

For example, the common driving voltage may include a first common driving voltage VDD and a second common driving voltage VSS. In this case, the display panel 110 may include common driving voltage lines VDDL and VSSL to supply the common driving voltage.

For example, as shown in FIGS. 10 to 11, the second common driving voltage VSS may be applied to the vertical metal line NC_VLIA. In this case, the display panel 110 may further include a second common driving voltage line VSSL for supplying the second common driving voltage VSS to the cathode CAT corresponding to the common electrode for configuring the light emitting device ED of each of the plurality of subpixels SP.

If the vertical metal line NC_VLIA is electrically connected to the second common driving voltage line VSSL for transmitting the second common driving voltage VSS, a connection position between the vertical metal line NC_VLIA and the second common driving voltage line VSSL may be located in a non-active area NA as shown in FIG. 10, or may be located in an active area AA as shown in FIG. 11.

Referring to FIG. 10, the vertical metal line NC_VLIA may be electrically connected to a second common driving voltage line VSSL disposed in the non-active area NA through the outer common voltage contact hole CNT_VSS_NA located in the non-active area NA. That is, the vertical metal line NC_VLIA may be electrically connected to the second common driving voltage line VSSL in the non-active area NA.

Referring to FIG. 11, the vertical metal line NC_VLIA may be electrically connected to a second common driving voltage line VSSL disposed in the non-active area NA through the internal common voltage contact hole CNT_VSS_AA located in the active area AA. That is, the vertical metal line NC_VLIA may be electrically connected to the second common driving voltage line VSSL in the active area AA.

In this case, as shown in FIG. 11, the vertical metal line NC_VLIA may be electrically connected to a second common driving voltage line VSSL disposed in the non-active area NA through the outer common voltage contact hole CNT_VSS_NA located in the non-active area NA.

As shown in FIGS. 9 to 11, when forming a data link structure, the remaining metals (e.g., horizontal metal line, vertical metal line) may be electrically connected to the second common driving voltage line VSSL, thereby reducing the resistance of the second common driving voltage line VSSL. That is, the resistance on the transmission path of the second common driving voltage VSS may be reduced.

Figure 12:
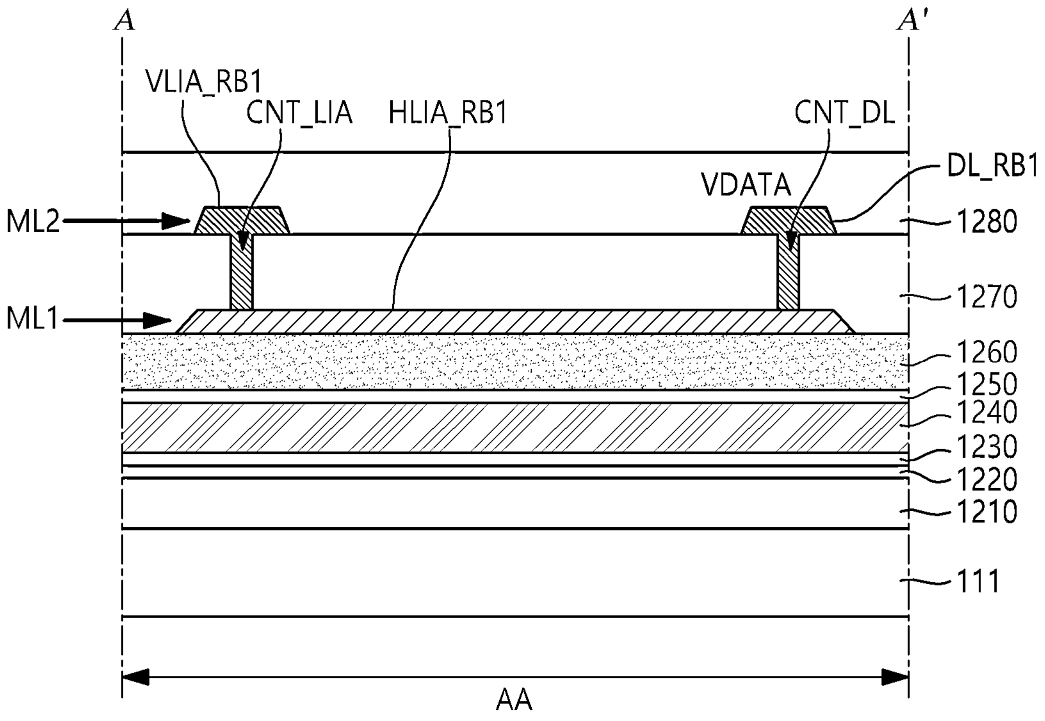
FIGS. 12 to 15 are cross-sectional views illustrating a data link structure of a display panel according to embodiments of the present disclosure.
Figure 13:
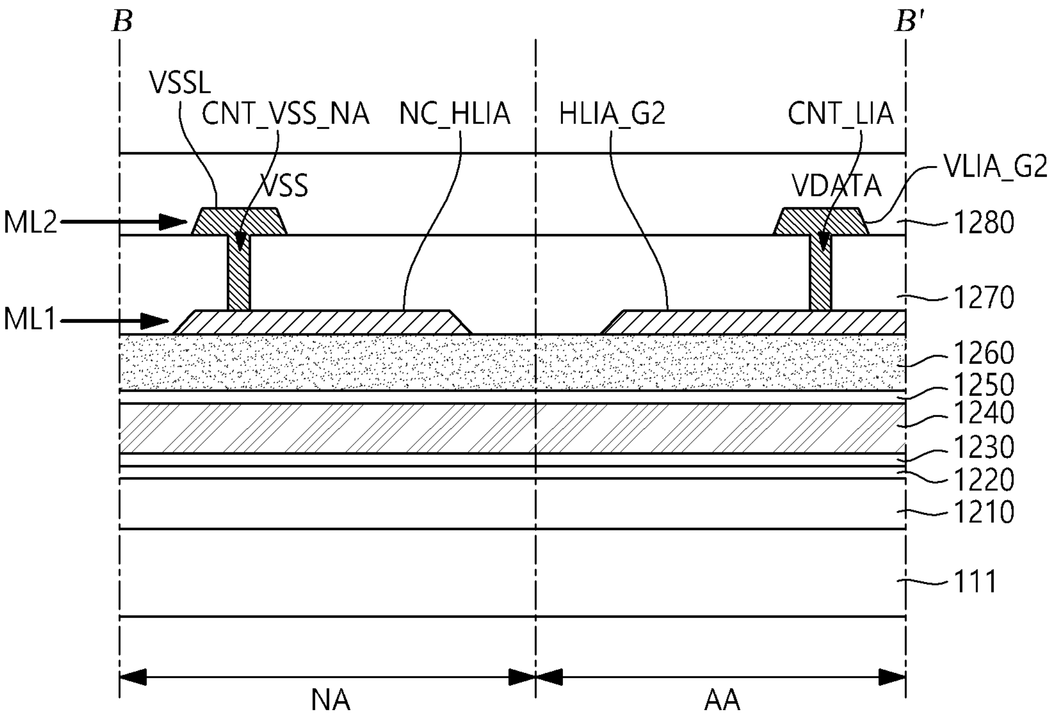
Figure 14:
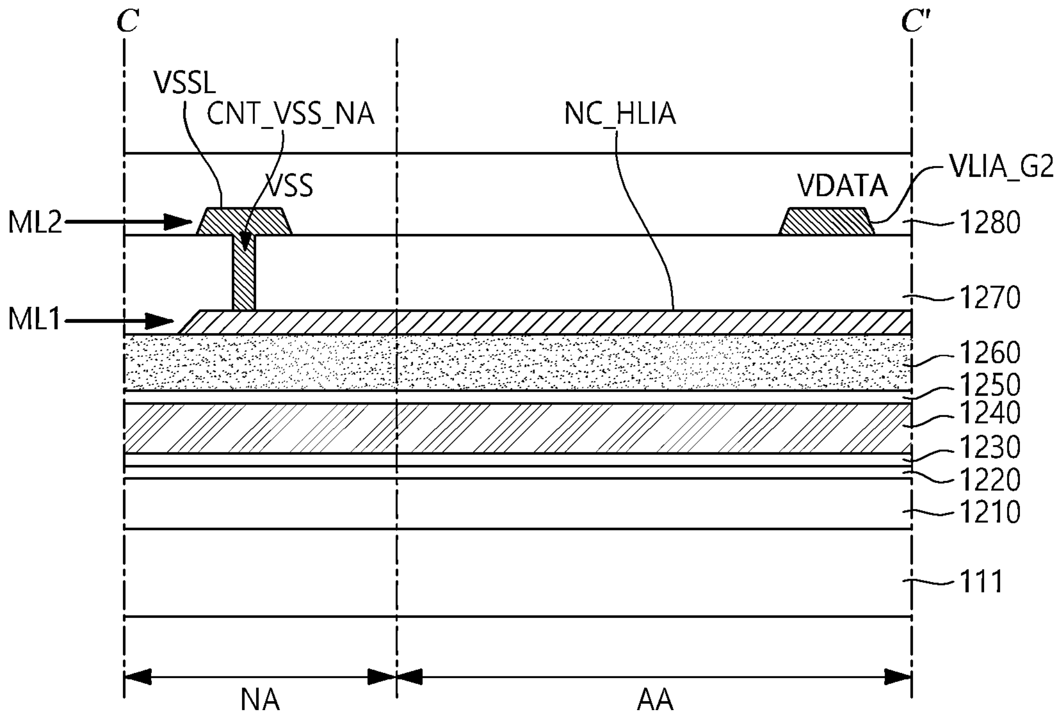
Figure 15:
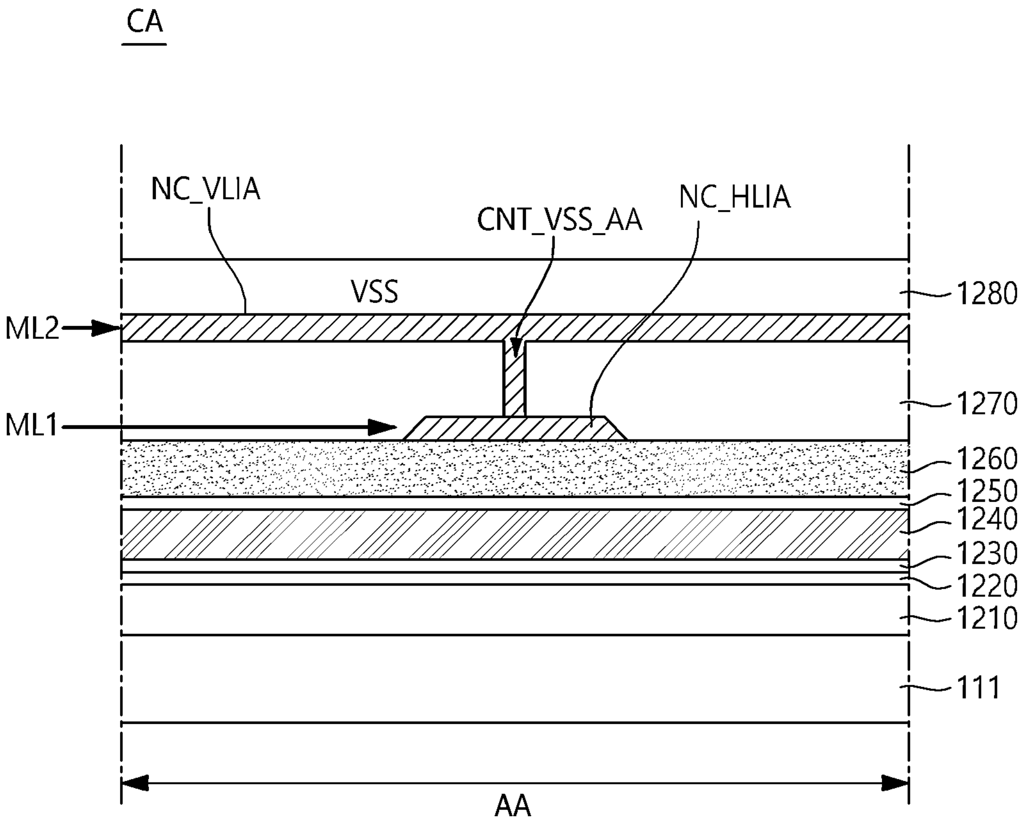

FIGS. 12 to 15 are cross-sectional views illustrating the data link structure of the display panel 110 according to embodiments of the present disclosure. FIG. 12 is a cross-sectional view of area A-A' in FIG. 10, FIG. 13 is a cross-sectional view of area B-B' in FIG. 10, FIG. 14 is a cross-sectional view of area C-C' in FIG. 10, and FIG. 15 is a cross-sectional view of the contact area CA in FIG. 11.

Referring to FIGS. 12 to 15, the display panel 110 according to embodiments of the present disclosure may include a first metal layer ML1 and a second metal layer ML2 to form a data link structure. An insulating layer 1270 may be disposed between the first metal layer ML1 and the second metal layer ML2.

Referring to FIGS. 12 to 15, the display panel 110 may include a first buffer layer 1210 on the substrate 111, a first gate insulating film 1220 on the first buffer layer 1210, and a first interlayer insulating film 1230 on the first gate insulating film 1220.

Referring to FIGS. 12 to 15, the display panel 110 may include a second buffer layer 1240 on the first interlayer insulating film 1230, a second gate insulating film 1250 on the second buffer layer 1240, and a second interlayer insulating film 1260 on the second gate insulating film 1250.

Referring to FIGS. 12 to 15, a first semiconductor material layer may be disposed above or below the first gate insulating film 1220. A second semiconductor material layer may be disposed above or below the second gate insulating film 1250. Here, the first semiconductor material disposed in the first semiconductor material layer and the second semiconductor material disposed in the second semiconductor material layer may be different from each other. For example, the first semiconductor material may be a polysilicon semiconductor material, and the second semiconductor material may be an oxide semiconductor material. For example, the polysilicon semiconductor material may be low-temperature polycrystalline silicon (LTPS).

Referring to FIGS. 12 to 15, the display panel 110 may include a first metal layer ML1 on the second interlayer insulating film 1260, a first planarization layer 1270 on the first metal layer ML1, a second metal layer ML2 on the first planarization layer 1270, and a second planarization layer 1280 on the second metal layer ML2.

Referring to FIGS. 12 to 15, the first metal layer ML1 may be a metal layer on which lines extending in the row direction (e.g., horizontal direction) are disposed. The second metal layer ML2 may be a metal layer on which lines extending in a column direction (e.g., vertical direction) are disposed.

Referring to FIGS. 12 to 15, the first metal layer ML1 may be a metal layer on which a line parallel to the gate line GL is disposed, and the second metal layer ML2 may be a metal layer on which a line parallel to the data line DL is disposed.

Referring to FIGS. 12 to 15, the first metal layer ML1 may be a metal layer where horizontal link lines (e.g., HLIA_RB1, HLIA_G2) and horizontal metal lines NC_HLIA are disposed. The second metal layer ML2 may be a metal layer where a data line (e.g., DL_RB1), a vertical link line (e.g., VLIA_RB1, VLIA_G2), and a vertical metal line NC_VLIA are disposed. The second metal layer ML2 may be a metal layer on which a second common driving voltage line VSSL is further disposed.

Referring to FIGS. 12 to 15, the horizontal link lines (HLIA, for example, HLIA_RB1 and HLIA_G2) included in each of the plurality of link lines LINK may be located in the first metal layer ML1 on the layer where the plurality of gate lines GL are disposed, and the vertical link lines VLIA (e.g., VLIA_RB1 and VLIA_G2 included in each of the plurality of link lines LINK may be located in the second metal layer ML2 on the first metal layer ML1.

Referring to FIG. 12, in the active area AA, the third vertical link line VLIA_RB1 may be electrically connected to the third horizontal link line HLIA_RB1 through a link line connection hole CNT_LIA, which is a contact hole of the first planarization layer 1270.

Referring to FIG. 12, in the active area AA, the third data line DL_RB1 may be electrically connected to the third horizontal link line HLIA_RB1 through a data line connection hole CNT_DL, which is a contact hole of the first planarization layer 1270.

Referring to FIG. 12, the third vertical link line VLIA_RB1 and the third data line DL_RB1 may be disposed in the second metal layer ML2, and the third horizontal link line HLIA_RB1 may be disposed in the first metal layer ML1.

Referring to FIG. 12, the data voltage VDATA may be supplied to the subpixels SP_R and SP_B connected to the third data line DL_RB1 through the third vertical link line VLIA_RB1, the third horizontal link line HLIA_RB1 and the third data line DL_RB1.

Referring to FIG. 12, the third vertical link line VLIA_RB1 and the third horizontal link line HLIA_RB1 may be disposed in the active area AA.

Referring to FIG. 13, in the active area AA, the second vertical link line VLIA_G2 may be electrically connected to the second horizontal link line HLIA_G2 through a link line connection hole CNT_LIA, which is a contact hole of the first planarization layer 1270.

Referring to FIG. 13, the second vertical link line VLIA_G2 and the second horizontal link line HLIA_G2 may be disposed in the active area AA.

Referring to FIG. 13, in the non-active area NA, the second common driving voltage line VSSL may be electrically connected to the horizontal metal line NC_HLIA through the outer common voltage contact hole CNT_VSS_NA, which is a contact hole of the first planarization layer 1270.

Referring to FIG. 13, the second vertical link line VLIA_G2 and the second common driving voltage line VSSL may be disposed in the second metal layer ML2, and the second horizontal link line HLIA_G2 and the horizontal metal line NC_HLIA may be disposed in the first metal layer ML1.

Referring to FIG. 14, in the non-active area NA, the second common driving voltage line VSSL may be electrically connected to the horizontal metal line NC_HLIA through the outer common voltage contact hole CNT_VSS_NA, which is a contact hole of the first planarization layer 1270.

Referring to FIG. 14, this horizontal metal line NC_HLIA may extend to the active area AA.

Referring to FIG. 14, the horizontal metal line NC_HLIA may intersect and overlap the data line VLIA_G2 extending in the column direction (e.g., vertical direction).

Referring to FIG. 15, in the active area AA, the vertical metal line NC_VLIA may be electrically connected to the horizontal metal line NC_HLIA through the outer common voltage contact hole CNT_VSS_AA, which is a contact hole of the first planarization layer 1270.

Referring to FIG. 15, at least one of the vertical metal line NC_VLIA and the horizontal metal line NC_HLIA may be electrically connected to the second common driving voltage line VSSL disposed in the non-active area NA.

Referring to FIG. 15, the vertical metal line NC_VLIA may be disposed in the second metal layer ML2, and the horizontal metal line NC_HLIA may be disposed in the first metal layer ML1.

Figure 16:
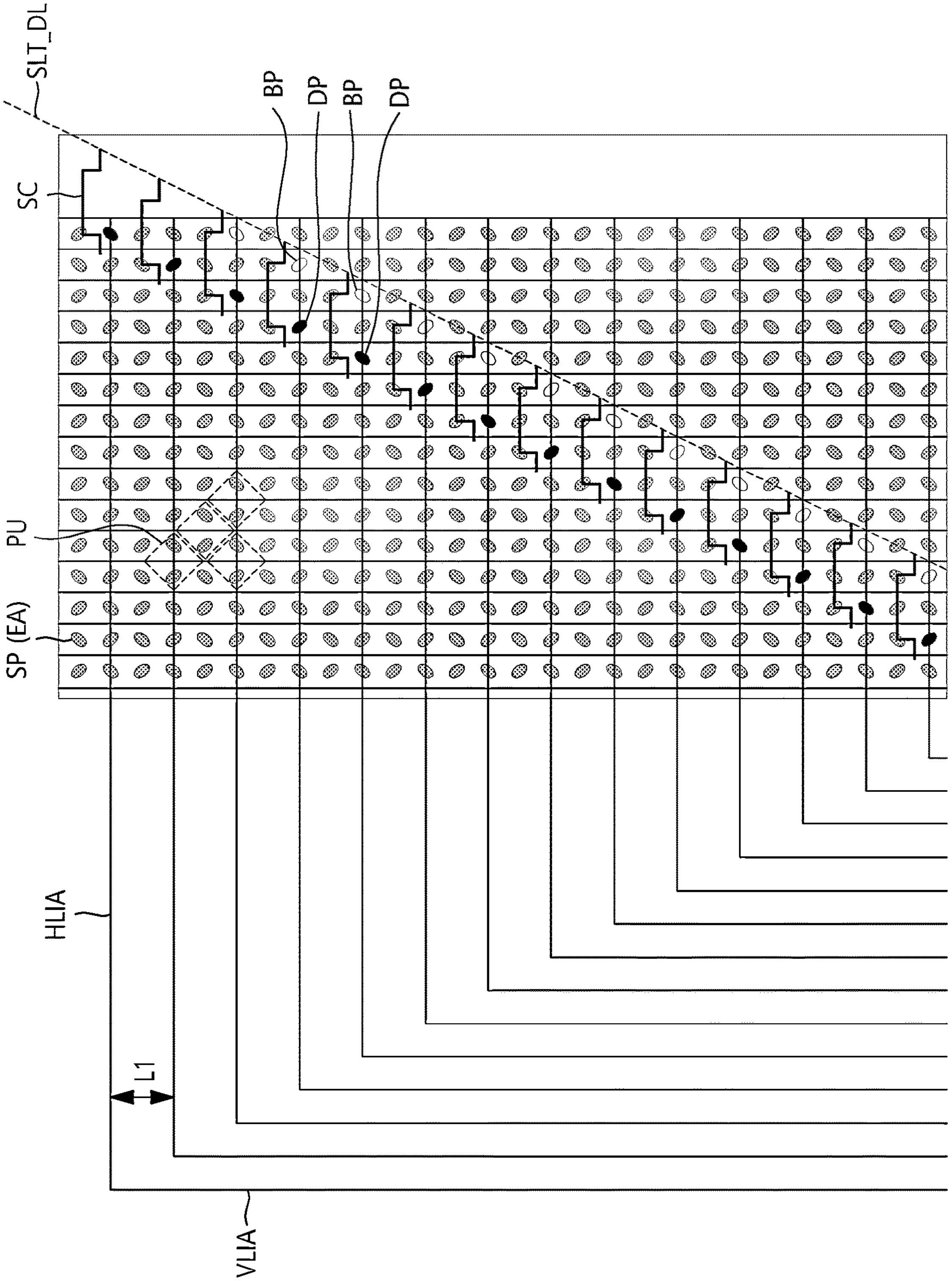
FIG. 16 illustrates a slant line crosstalk phenomenon according to the data link structure of FIG. 6.

FIG. 16 illustrates a slant line crosstalk phenomenon according to the data link structure of FIG. 6.

Referring to FIG. 16, as in the data link structure of FIG. 6, in the case that the horizontal link lines HLIA connected to the vertical link lines VLIA are arranged for one or two pixel lines, the dark points DP and bright points BP may occur for each unit pixel at or near the slant line SLT_DL. Here, one pixel line may include unit pixels PU arranged in the row direction.

Referring to FIG. 16, one or two pixel lines may correspond to one gate line GL. That is, each of the horizontal link lines HLIA may correspond to one gate line GL.

Referring to FIG. 16, each of the horizontal link lines HLIA may overlap with the gate line GL. Accordingly, dark points DP and bright points BP may be generated at timings when the voltage level of the scan signal SC applied to the gate line GL changes. For example, when the voltage level of the scan signal SC rises, a dark point DP may occur. When the voltage level of the scan signal SC falls, a bright point BP may occur.

Referring to FIG. 16, when the display panel 110 has the data link structure of FIG. 6, the horizontal link line HLIA have a narrow first gap L1. Here, the first gap L1 may correspond to a gap or spacing between two adjacent pixel lines, a gap or spacing between a first pixel line and a third pixel line, or a gap or spacing between two adjacent gate lines GL, or a gap or spacing between the first gate line GL and the third gate line GL.

As described above, if the display panel 110 has the data link structure of FIG. 6, the horizontal link lines HLIA have a narrow first gap L1, so that the dark point DP and the bright point BP may occur along a slant line SLT_DL for each one or two pixel lines. Accordingly, the dark point DP and bright point BP generated along the slant line SLT_DL may be recognized very clearly by the user. Accordingly, the user may easily recognize severe image defects.

Figure 17:
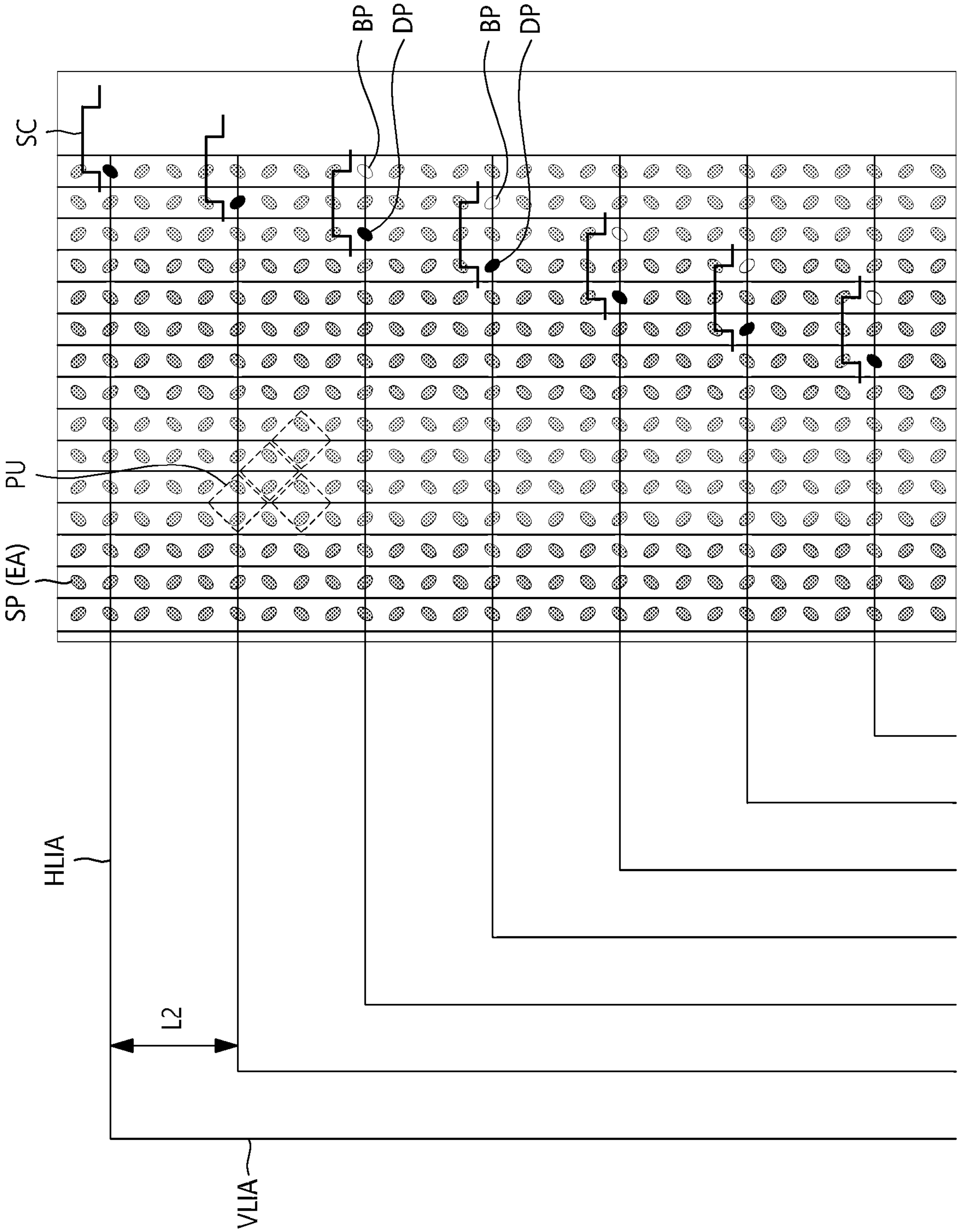
FIG. 17 illustrates a slant line crosstalk phenomenon according to the data link structure of FIGS. 7 to 11.

FIG. 17 illustrates a slant line crosstalk phenomenon according to the data link structure of FIGS. 7 to 11.

Referring to FIG. 17, as in the data link structure of FIGS. 7 to 11, if the horizontal link lines HLIA connected to the vertical link lines VLIA are arranged for each of three or more pixel lines, there may be generated the dark points DP and the bright points BP for each unit pixel at or near the slant line SLT_DL. Here, one pixel line may include unit pixels PU arranged in the row direction.

Referring to FIG. 17, three or more pixel lines may correspond to three or more gate lines GL. That is, each of the horizontal link lines HLIA may correspond to one gate line GL.

Referring to FIG. 17, some of the gate lines GL may overlap with the horizontal link line HLIA, and some of the gate lines GL do not overlap with the horizontal link line HLIA.

Referring to FIG. 17, at the timing when the voltage level of the scan signal SC applied to the gate line GL changes, there may be generated the dark points DP and the bright points BP at a position corresponding to the gate line GL overlapping the horizontal link line HLIA. For example, when the voltage level of the scan signal SC rises, a dark point DP may occur. When the voltage level of the scan signal SC falls, a bright point BP may occur.

However, at the timing when the voltage level of the scan signal SC applied to the gate line GL changes, the dark points DP and the bright points BP may not occur at a position corresponding to the gate line GL which does not overlap the horizontal link line HLIA.

Therefore, referring to FIG. 17, if the display panel 110 has the data link structure of FIGS. 7 to 11, the horizontal link lines HLIA have a second gap L2 wider than the first gap L1. Here, the second gap L2 may be wider than the first gap L1 by at least a gap P between two adjacent pixel lines (i.e., $L2 \geq L1+P$).

Accordingly, if the display panel 110 has the data link structure of FIGS. 7 to 11, the horizontal link lines HLIA have the second gap L2 wider than the narrow first gap L1 in the data link structure of FIG. 6, so that the dark points DP and the bright points BP may occur sporadically along the slant line SLT_DL for each of three or more pixel lines. Accordingly, the dark points DP and the bright points BP generated along the slant line SLT_DL may not easily recognized by the user.

Embodiments of the present disclosure described above are briefly described as follows.

A display device according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, a second pad disposed in the pad area, a second data line disposed in the active area and extending in the column direction, a second horizontal link line disposed in the active area, extending in the row direction, and electrically connected to the second data line, a second vertical link line disposed in the active area, extending in the column direction, and electrically connecting the second horizontal link line and the second pad, first subpixels connected to the first data line and emitting a first color light, second subpixels connected to the second data line and emitting the first color light, and two or more subpixel lines which emit the first color light and are disposed between the first horizontal link line and the second horizontal link line.

The active area may include a central area, a first area, and a second area adjacent to each other in the row direction, the first area may be located on one side of the central area, and the second area may be located on the other side of the central area. The first data line and the second data line may be both located in one of the first area and the second area.

A display device according to embodiments of the present disclosure may further include at least one first gate line corresponding to the first horizontal link line, and at least one second gate line corresponding to the second horizontal link line.

At least a portion of the first horizontal link line may overlap with the at least one first gate line, and at least a portion of the second horizontal link line may overlap with the at least one second gate line.

A length of the first horizontal link line may be shorter than a length of the second horizontal link line, and a length of the first vertical link line may be shorter than a length of the second vertical link line.

A display device according to embodiments of the present disclosure may further include a plurality of third subpixels emitting second or third color light different from the first color light, a third data line for supplying a data voltage to the third subpixel, a third pad disposed in the pad area, a third horizontal link line disposed in the active area, extending in the row direction, and electrically connected to the third data line, and a third vertical link line disposed in the active area, extending in the column direction, and electrically connecting the third data line and the third pad.

The third horizontal link line may be disposed between the first horizontal link line and the second horizontal link line.

The third horizontal link line may be disposed closer to the first horizontal link line or may be disposed closer to the second horizontal link line among the first horizontal link line and the second horizontal link line.

The first horizontal link line and the second horizontal link line may be located in a first metal layer on a layer where a gate line is disposed, and the first vertical link line and the second vertical link line may bee located in a second metal layer on the first metal layer.

A display device according to embodiments of the present disclosure may further include a common driving voltage line for supplying a common driving voltage to a common electrode for configuring a light emitting device of each of the first and second subpixels, and a horizontal metal line which is disposed to extend in the row direction in the same way as the first horizontal link line, is located in a first metal layer in the same way as the first horizontal link line, and is spaced apart from the first horizontal link line.

The horizontal metal line may be electrically floating or electrically connected to the common driving voltage line.

The horizontal metal line may be electrically connected to the common driving voltage line in the non-active area, or may be electrically connected to the common driving voltage line in the active area.

A display device according to embodiments of the present disclosure may further include a common driving voltage line for supplying a common driving voltage to a common electrode for configuring a light emitting device of each of the first and second subpixels, and a vertical metal line which is disposed to extend in the column direction in the same way as the first vertical link line, is located in a second metal layer in the same way as the first vertical linkline, and is spaced apart from the first vertical link line.

The vertical metal line may be electrically floating or electrically connected to the common driving voltage line.

The vertical metal line may be electrically connected to the common driving voltage line in the non-active area, or may be electrically connected to the common driving voltage line in the active area.

A display device according to embodiments of the present disclosure may further include a third gate line disposed between the first horizontal link line and the second horizontal link line.

In the display device according to embodiments of the present disclosure, there may be no horizontal link line overlapping with the third gate line.

A display panel according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, a first gate line overlapping with the first horizontal link line, a second pad disposed in the pad area, a second data line disposed in the active area and extending in the column direction, a second horizontal link line disposed in the active area, extending in the row direction, and electrically connected to the second data line, a second vertical link line disposed in the active area, extending in the column direction, and electrically connecting the second horizontal link line and the second pad, a second gate line overlapping with the second horizontal link line, and a third gate line disposed between the first gate line and the second gate line and having no overlapping horizontal link line.

A display panel according to embodiments of the present disclosure may further include a common driving voltage line for supplying a common driving voltage to a common electrode for configuring a light emitting device of each of subpixels, and a horizontal metal line which is disposed to extend in the row direction in the same way as the first horizontal link line, is located in a first metal layer in the same way as the first horizontal link line, and is spaced apart from the first horizontal link line.

The horizontal metal line may be electrically floating or electrically connected to the common driving voltage line.

A display panel according to embodiments of the present disclosure may further include a common driving voltage line for supplying a common driving voltage to a common electrode for configuring a light emitting device of each of subpixels, and a vertical metal line which is disposed to extend in the column direction in the same way as the first vertical link line, is located in a second metal layer in the same way as the first vertical link line, and is spaced apart from the first vertical link line.

The vertical metal line may be electrically floating or electrically connected to the common driving voltage line.

A display device according to embodiments of the present disclosure may include an active area capable of displaying images, a non-active area located outside the active area and including a pad area, a first pad disposed in the pad area, a first data line disposed in the active area and extending in a column direction, a first horizontal link line disposed in the active area, extending in a row direction, and electrically connected to the first data line, a first vertical link line disposed in the active area, extending in the column direction, and electrically connecting the first horizontal link line and the first pad, and a common driving voltage line for supplying a common driving voltage to a common electrode for configuring a light emitting device of each of subpixels.

A display device according to embodiments of the present disclosure may further include at least one of a horizontal metal line disposed to extend in the row direction in the same manner as the first horizontal link line, located within a first metal layer in the same manner as the first horizontal link line, and spaced apart from the first horizontal link line, and a vertical metal line disposed to extend in the column direction in the same manner as the first vertical link line, located in a second metal layer in the same manner as the first vertical link line, and spaced apart from the first vertical link line.

At least one of the horizontal metal line and the vertical metal line may be electrically floating or electrically connected to the common driving voltage line.

A display device according to embodiments of the present disclosure may further include a first gate line overlapping with the first horizontal link line, a second pad disposed in the pad area, a second data line disposed in the active area and extending in the column direction, a second horizontal link line disposed in the active area, extending in the row direction, and electrically connected to the second data line, a second vertical link line disposed in the active area, extending in the column direction, and electrically connecting the second horizontal link line and the second pad, a second gate line overlapping with the second horizontal link line, and a third gate line disposed between the first gate line and the second gate line and having no overlapping horizontal link lines.

According to the embodiments of the present disclosure, there may provide a display panel and a display device having a data link structure for bezel reduction.

According to the embodiments of the present disclosure, there may provide a display panel and a display device with a data link structure capable of reducing image abnormalities caused by crosstalk between a link line and a gate line.

According to the embodiments of the present disclosure, there may provide a display panel and a display device with a data link structure capable of reducing a resistance in a transmission path of a common driving voltage.

According to embodiments of the present disclosure, it is possible to reduce the weight of the display panel and display device by reducing a bezel through the data link structure The above description and the accompanying drawings provide an example of the technical idea of the present disclosure for illustrative purposes only. Various modifications, additions and substitutions to the described embodiments will be readily apparent to those skilled in the art without departing from the spirit and scope of the present disclosure. In addition, the disclosed embodiments are intended to illustrate the scope of the technical idea of the present disclosure. Thus, the scope of the present disclosure is not limited to the embodiments shown.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

an active area configured to display images;

a non-active area adjacent to the active area, the non-active area including a pad area;

a first pad disposed in the pad area;

a first data line disposed in the active area and extending in a column direction;

a first horizontal link line disposed in the active area, extending in a row direction, and electrically connected to the first data line;

a first vertical link line disposed in the active area, extending in the column direction, and electrically connecting the first horizontal link line and the first pad;

a second pad disposed in the pad area;

a second data line disposed in the active area and extending in the column direction;

a second horizontal link line disposed in the active area, extending in the row direction, and electrically connected to the second data line;

a second vertical link line disposed in the active area, extending in the column direction, and electrically connecting the second horizontal link line and the second pad;

first subpixels electrically connected to the first data line and emitting a first color light;

second subpixels electrically connected to the second data line and emitting the first color light; and two or more subpixel lines extending in the row direction which emit the first color light and are disposed between the first horizontal link line and the second horizontal link line, wherein the first horizontal link line and the second horizontal link line are spaced apart by a distance, and wherein the distance between the first horizontal link line and the second horizontal link line disposed adjacent to each other among horizontal link lines electrically connected to data lines electrically connected to subpixels emitting the first color light is greater than twice a spacing between two adjacent subpixel lines of the first color light extending in the row direction.

2. The display device of claim 1, wherein the active area includes a central area, a first area, and a second area adjacent to each other in the row direction, wherein the first area is located on one side of the central area, and the second area is located on the other side of the central area, and wherein the first data line and the second data line are both located in one of the first area and the second area.

3. The display device of claim 1, further comprising:

at least one first gate line corresponding to the first horizontal link line; and at least one second gate line corresponding to the second horizontal link line, wherein a portion of the first horizontal link line overlaps with the first gate line, and a portion of the second horizontal link line overlaps with the second gate line.

4. The display device of claim 1, wherein a length of the first horizontal link line is shorter than a length of the second horizontal link line, and a length of the first vertical link line is shorter than a length of the second vertical link line.

5. The display device of claim 1, further comprising:

a plurality of third subpixels emitting second or third color light different from the first color light;

a third data line for supplying a data voltage to a third subpixel of the plurality;

a third pad disposed in the pad area;

a third horizontal link line disposed in the active area, extending in the row direction, and electrically connected to the third data line; and a third vertical link line disposed in the active area, extending in the column direction, and electrically connecting the third horizontal link line and the third pad, wherein the third horizontal link line is disposed between the first horizontal link line and the second horizontal link line.

6. The display device of claim 5, wherein the third horizontal link line is disposed closer to the first horizontal link line among the first horizontal link line and the second horizontal link line.

7. The display device of claim 5, wherein the third horizontal link line is disposed closer to the second horizontal link line among the first horizontal link line and the second horizontal link line.

8. The display device of claim 1, wherein the first horizontal link line and the second horizontal link line are located in a first metal layer on a layer where a gate line is disposed, and wherein the first vertical link line and the second vertical link line are located in a second metal layer on the first metal layer.

9. The display device of claim 1, further comprising:

a common driving voltage line for supplying a common driving voltage to a common electrode of a light emitting device of each of the first and second subpixels; and a horizontal metal line which is disposed to extend in the row direction, is located in a first metal layer, and is spaced apart from the first horizontal link line, wherein the horizontal metal line is either electrically floating or electrically connected to the common driving voltage line.

10. The display device of claim 9, wherein the horizontal metal line is electrically connected to the common driving voltage line in the non-active area.

11. The display device of claim 9, wherein the horizontal metal line is electrically connected to the common driving voltage line in the active area.

12. The display panel of claim 11, further comprising:

a non-active area link line disposed in the non-active area, integrated with or electrically connected to any one or both of the first vertical link line and the second vertical link line.

13. The display device of claim 1, further comprising:

a common driving voltage line for supplying a common driving voltage to a common electrode of a light emitting device of each of the first and second subpixels; and a vertical metal line which is disposed to extend in the column direction, is located in a second metal layer, and is spaced apart from the first vertical link line, wherein the vertical metal line is either electrically floating or electrically connected to the common driving voltage line.

14. The display device of claim 13, wherein the vertical metal line is electrically connected to the common driving voltage line in the non-active area.

15. The display device of claim 13, wherein the vertical metal line is electrically connected to the common driving voltage line in the active area.

16. The display device of claim 1, further comprising a third gate line disposed between the first horizontal link line and the second horizontal link line, wherein there is no horizontal link line overlapping with the third gate line.

17. A display panel comprising:

an active area configured to display images;

a non-active area adjacent to the active area, the non-active area including a pad area;

a first pad disposed in the pad area;

a first data line disposed in the active area and extending in a column direction;

a first horizontal link line disposed in the active area, extending in a row direction, and electrically connected to the first data line;

a first vertical link line disposed in the active area, extending in the column direction, and electrically connecting the first horizontal link line and the first pad;

a first gate line overlapping with the first horizontal link line;

a second pad disposed in the pad area;

a second data line disposed in the active area and extending in the column direction;

a second horizontal link line disposed in the active area, extending in the row direction, and electrically connected to the second data line;

a second vertical link line disposed in the active area, extending in the column direction, and electrically connecting the second horizontal link line and the second pad;

a second gate line overlapping with the second horizontal link line;

a third gate line disposed between the first gate line and the second gate line and having no overlaps with a horizontal link line;

first subpixels electrically connected to the first data line and emitting a first color light;

second subpixels electrically connected to the second data line and emitting the second color light different from the first color light; and at least three first-color subpixel lines extending in the row direction and disposed between the first horizontal link line and the second horizontal link line, wherein a distance (L) between the first horizontal link line and the second horizontal link line disposed adjacent to each other among horizontal link lines electrically connected to data lines electrically connected to subpixels emitting the first color light is greater than twice a spacing (K) between adjacent first-color subpixel lines ($L>2K$).

18. The display panel of claim 17, further comprising:

a common driving voltage line for supplying a common driving voltage to a common electrode of a light emitting device of each of subpixels; and a horizontal metal line which is disposed to extend in the row direction, is located in a first metal layer, and is spaced apart from the first horizontal link line, wherein the horizontal metal line is either electrically floating or electrically connected to the common driving voltage line.

19. The display panel of claim 17, further comprising:

a common driving voltage line for supplying a common driving voltage to a common electrode of a light emitting device of each of the first and second subpixels; and a vertical metal line which is disposed to extend in the column direction, is located in a second metal layer, and is spaced apart from the first vertical link line, wherein the vertical metal line is either electrically floating or electrically connected to the common driving voltage line.

20. A display panel comprising:

an active area configured to display images;

a non-active area adjacent to the active area, the non-active area including a pad area;

a first pad disposed in the pad area;

a first data line disposed in the active area and extending in a column direction;

a first horizontal link line disposed in the active area, extending in a row direction, and electrically connected to the first data line;

a first vertical link line disposed in the active area, extending in the column direction, and electrically connecting the first horizontal link line and the first pad;

a first gate line overlapping with the first horizontal link line;

a second pad disposed in the pad area;

a second data line disposed in the active area and extending in the column direction;

a second horizontal link line disposed in the active area, extending in the row direction, and electrically connected to the second data line;

a second vertical link line disposed in the active area, extending in the column direction, and electrically connecting the second horizontal link line and the second pad;

a second gate line overlapping with the second horizontal link line;

first subpixels electrically connected to the first data line and emitting a first color light; and second subpixels electrically connected to the second data line and emitting the second color light different from the first color light, wherein a first area where the first horizontal link line overlaps with the first gate line is greater than a second area where the second horizontal link line overlaps with the second gate line, and wherein a distance between the first horizontal link line and the second horizontal link line disposed adjacent to each other among horizontal link lines electrically connected to data lines electrically connected to subpixels emitting the first color light is greater than twice a spacing between two adjacent subpixel lines of the first color light extending in the row direction.

* * * * *